United States Patent
Lee et al.

(10) Patent No.: US 8,054,551 B2
(45) Date of Patent: Nov. 8, 2011

(54) DISPLAY DEVICE AND METHOD OF FABRICATING THE SAME

(75) Inventors: Hae-Yeon Lee, Buchoen-si (KR); Young-In Hwang, Yongin-si (KR); Baek-Woon Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 12/470,103

(22) Filed: May 21, 2009

(65) Prior Publication Data

US 2010/0118408 A1    May 13, 2010

(30) Foreign Application Priority Data

Nov. 11, 2008 (KR) .................. 10-2008-0111719

(51) Int. Cl.
G02B 13/20 (2006.01)
G02B 5/02 (2006.01)

(52) U.S. Cl. .................. 359/599; 359/900; 257/635

(58) Field of Classification Search .................. 359/599, 359/601–614, 350–361, 577–590
See application file for complete search history.

(56) References Cited

U.S. PATENT DOCUMENTS

| 4,460,940 | A  | * | 7/1984 | Mori ............................ 362/558 |
| 5,739,579 | A  | * | 4/1998 | Chiang et al. ................. 257/635 |
| 6,704,335 | B1 | * | 3/2004 | Koyama et al. ............ 372/43.01 |
| 6,756,732 | B1 | * | 6/2004 | Kawase ......................... 313/504 |
| 6,937,399 | B2 | * | 8/2005 | Takahashi et al. ............ 359/599 |
| 7,084,056 | B2 | * | 8/2006 | Won ............................... 438/627 |
| 7,419,272 | B2 | * | 9/2008 | Schenke et al. ............... 359/614 |
| 2008/0180599 | A1 | * | 7/2008 | Ha et al. ........................ 349/64 |

FOREIGN PATENT DOCUMENTS

| JP | 2000284726 | 10/2000 |
| KR | 1020040106814 | 12/2004 |
| KR | 1020060055211 | 5/2006 |

* cited by examiner

*Primary Examiner* — Thong Nguyen
(74) *Attorney, Agent, or Firm* — H.C. Park & Associates, PLC

(57) ABSTRACT

The present invention provides a display device and a method of fabricating the same. The display device includes a substrate, a transflective layer including first diffusive layers and second diffusive layers alternately arranged on the substrate, the first diffusive layers including a first diffusive material having a first refractive index, and the second diffusive layers including a second diffusive material having a second refractive index different from the first refractive index, a plurality of via holes formed in the transflective layer, and a light-emitting layer disposed on the substrate.

20 Claims, 23 Drawing Sheets

DISPLAY DEVICE AND METHOD OF FABRICATING THE SAME

CROSS REFERENCE TO RELATED APPLICATION

This application claims priority from and the benefit of Korean Patent Application No. 10-2008-0111719, filed on Nov. 11, 2008, which is hereby incorporated by reference for all purposes as if fully set forth herein.

BACKGROUND OF THE INVENTION

1. Field of the Invention

The present invention relates to an organic light emitting diode (OLED) display device providing an increased viewing angle that may improve brightness thereof, and a method of fabricating the same.

2. Discussion of the Background

Demand has recently increased for display devices which are smaller, lighter, highly efficient, and of higher density than previous display devices. Flat panel display devices such as a liquid crystal display (LCD), a plasma display panel (PDP), an OLED display device, etc. have been researched and developed to meet this demand.

The OLED display device includes a pair of electrodes opposing each other, and a light-emitting layer disposed between the pair of electrodes.

In the light-emitting layer, a hole transmitted from a first electrode and an electron transmitted from a second electrode combine to form an exciton in the light-emitting layer. The light-emitting layer emits light during a deactivation process of the exciton. Accordingly, since an OLED display device does not require a separate light source, may have less power consumption, faster response rate, and higher contrast ratio than another type of flat panel display device, the OLED display device may be desirable as a flat panel display device.

However, light generated in the light-emitting layer may not be emitted to the outside due to total reflection of interfacial surface of elements of OLED display device. Thus the brightness of OLED display device may be reduced.

A microcavity may be formed within the OLED display device to improve brightness and color reproducibility using interference of light reflected from electrode.

Light intensity of light having a specific wavelength emitted in a front direction may be increased by using microcavity, but light intensity in other wavelengths may be decreased and color reproducibility of OLED display device may be degenerated.

SUMMARY OF THE INVENTION

The present invention provides an OLED display device having improved brightness by providing an increased viewing angle thereof.

The present invention also provides a method of fabricating an organic light emitting diode OLED display device having improved brightness by providing an increased viewing angle thereof.

Additional features of the invention will be set forth in the description which follows, and in part will be apparent from the description, or may be learned by practice of the invention.

The present invention discloses a display device including: a substrate; a transflective layer including first diffusive layers and second diffusive layers alternately arranged on the substrate, the first diffusive layers including a first diffusive material having a first refractive index, and the second diffusive layers including a second diffusive material having a second refractive index different from the first refractive index; a plurality of via holes formed in the transflective layer; and a light-emitting layer arranged on the substrate.

The present invention also discloses a method of fabricating a display device, the method including: forming a transflective layer including first diffusive layers and second diffusive layers alternately arranged on a substrate, the first diffusive layers including a first diffusive material having a first refractive index, the second diffusive layers including a second diffusive material having a second refractive index different from the first refractive index; forming a plurality of via holes in the transflective layer; and forming a light-emitting layer on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
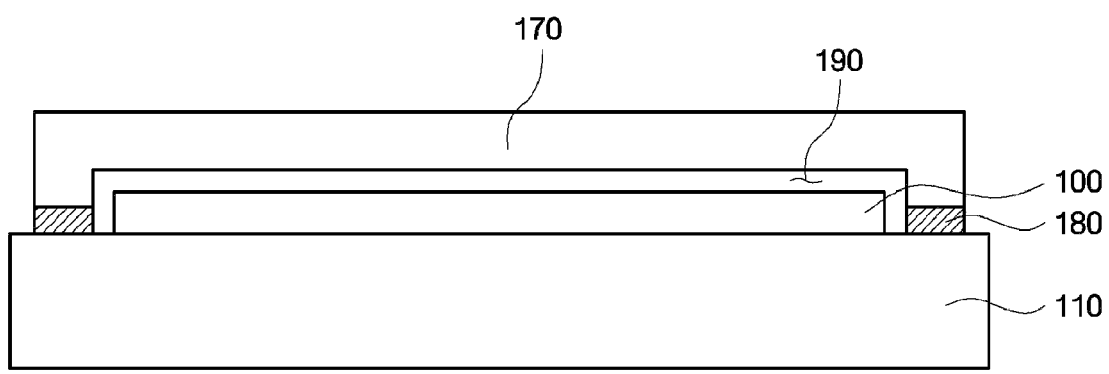
FIG. 1A is a schematic view of a display device including an encapsulation substrate, according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device according to an exemplary embodiment of the present invention may include a flat panel display device such as an LCD, a personal digital assistant (PDA), or an OLED. For the convenience of explanation, the present invention will be described with regard to an OLED display device by way of example. However, the present invention is not limited thereto and may include other flat panel display devices.

Hereinafter, exemplary embodiments of the present invention will be described in detail with reference to the accompanying drawings.

Figure 1B:
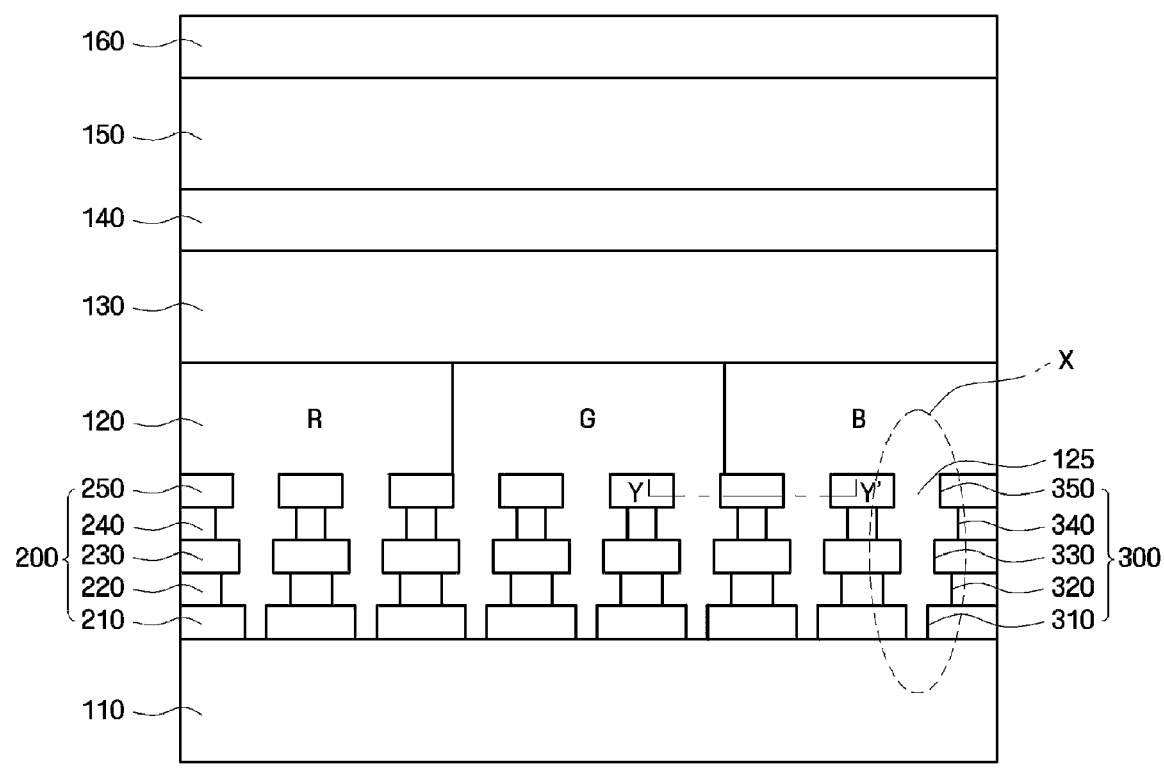
FIG. 1B is a vertical cross-sectional view of FIG. 1A, schematically showing the display device according to an exemplary embodiment of the present invention.
Figure 2:
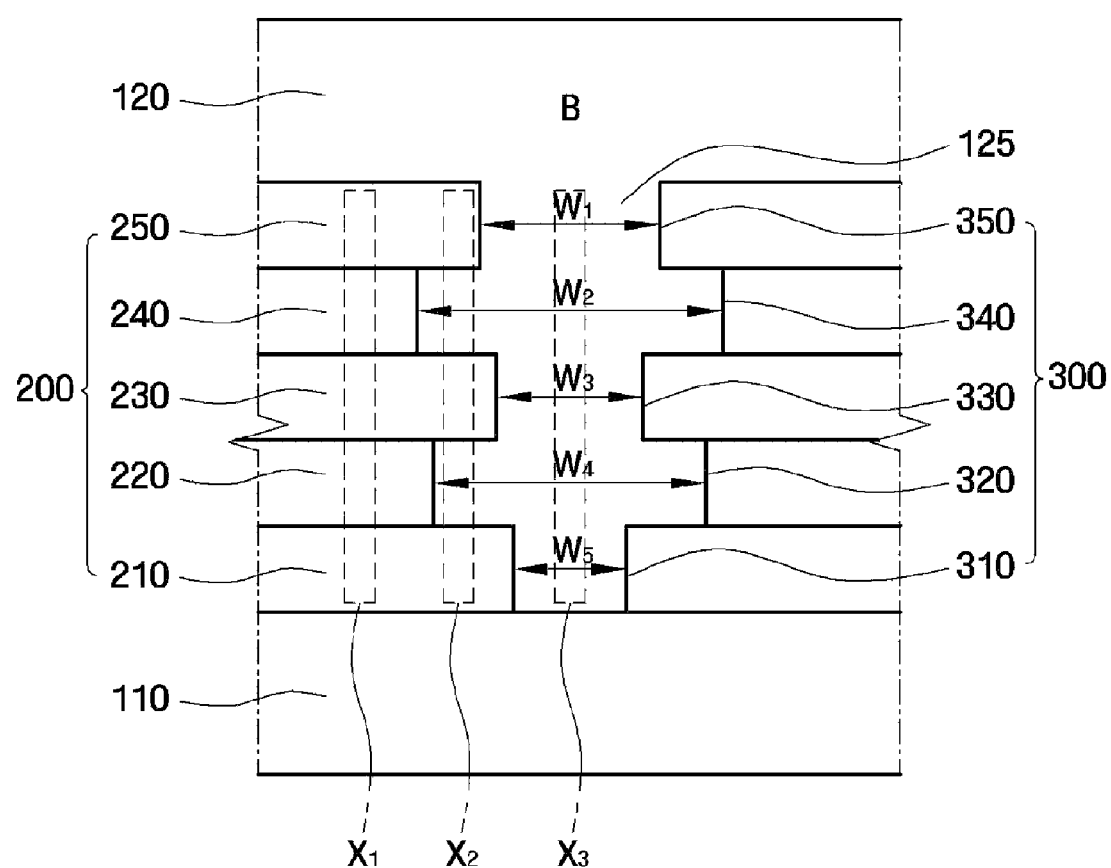
FIG. 2 is an enlarged cross-sectional view showing a portion 'X' in FIG. 1B.

Referring to FIG. 1A, FIG. 1B, and FIG. 2, a thin film transistor (TFT) display panel of the display device according to an exemplary embodiment of the present invention includes a substrate 110, a transflective layer 200, a color filter layer 120, an overcoat layer 130, an anode electrode 140, a light-emitting layer 150, a cathode electrode 160, and an encapsulation substrate 170.

The substrate 110 may be made of a light-transmitting material that allows light to pass through. For example, the substrate 110 may include a transparent insulating substrate such as glass, plastic, or other transparent materials.

The transflective layer 200 is formed on the substrate 110. The transflective layer 200 may be made of two or more materials having different refractive indices. The transflective layer 200 may include two or more layers, which are stacked in a direction substantially perpendicular to the substrate 110.

The transflective layer 200 includes a first transflective layer, which includes first diffusive layers 210, 230, and 250 having a first refractive index, and a second transflective layer disposed on the first diffusive layers 210, 230, and 250 and that includes second diffusive layers 220 and 240 having a second refractive index different from the first refractive index. The first diffusive layers 210, 230, and 250 and the second diffusive layers 220 and 240 are alternately arranged with respect to each other. In the present exemplary embodiment, not only a single pair of layers respectively selected from the first diffusive layers 210, 230, and 250 and from the second diffusive layers 220 and 240 are arranged on the substrate 110, but also two or more pairs of layers respectively selected from the first diffusive layers 210, 230, and 250 and from the second diffusive layers 220 and 240. In the present exemplary embodiment, 2.5 pairs of layers selected from the first diffusive layers 210, 230, and 250 and from the second diffusive layers 220 and 240 may be arranged on the substrate 110. In other words, five layers including the first diffusive layer 210, the second diffusive layer 220, the first diffusive layer 230, the second diffusive layer 240, and the first diffusive layer 250, are sequentially stacked on the substrate 110.

According to the present exemplary embodiment, 2.5 pairs of layers selected from the first diffusive layers 210, 230, and 250 and from the second diffusive layers 220 and 240 are arranged on the substrate 110, as described above. However, the arrangement of the transflective layer 200 is not limited to the exemplary embodiment described above, and the number of stacked first diffusive layers 210, 230, and 250 and second diffusive layers 220 and 240 may be smaller or larger than listed above.

The first diffusive layers 210, 230, and 250 may have a first refractive index, and the second diffusive layers 220 and 240 may have a second refractive index different from the first refractive index. The first diffusive layers 210, 230, and 250 and the second diffusive layers 220 and 240 may be made of different inorganic materials. The first diffusive layers 210, 230, and 250 may contain, for example, silicon oxide ($SiO_x$), and the second diffusive layers 220 and 240 may contain, for example, silicon nitride ($SiN_x$). When the first diffusive layers 210, 230, and 250 contain silicon oxide ($SiO_x$), they may have a refractive index of approximately 1.4, and when the second diffusive layers 220 and 240 contain silicon nitride ($SiN_x$), they may have a refractive index of approximately 1.6.

The via hole 300 is formed to penetrate the transflective layer 200. The via hole 300 may be filled with a third diffusive material 125 having a third refractive index different from the first or second refractive index. A plurality of via holes forming the via hole 300 may be formed in each layer of the transflective layer 200. In the present exemplary embodiment, the via hole 300 is formed through the whole length of the transflective layer 200. Alternatively, the via hole 300 may be formed to penetrate only some of the layers forming the transflective layer 200.

According to the present exemplary embodiment, via holes forming the via hole 300 have different inner diameters from one another in different layers of the transflective layer 200. The via hole 300 includes first via holes 310, 330, and 350 formed to penetrate the first diffusive layers 210, 230, and 250, and second via holes 320 and 340 formed to penetrate the second diffusive layers 220 and 240. Respective first inner diameters w1, w3, and w5 of the first via holes 350, 330, and 310, or second inner diameters w2 and w4 of the second via holes 340 and 320 may gradually increase as a distance between each layer of the transflective layer 200 and the substrate 110 increases. The first inner diameter w1 of the first via hole 350 in the first diffusive layer 250 positioned farthest from the substrate 110 may be larger than the first inner diameter w5 of the first via hole 310 in the first diffusive layer 210 positioned nearest to the substrate 110. The first inner diameter w3 of the first via hole 330 in the first diffusive layer 230 positioned between the first diffusive layers 210 and 250 may have the first inner diameter w3 that is smaller than the first inner diameter w1 and larger than the first inner diameter w5.

The second inner diameter w2 of the second via hole 340 in the second diffusive layer 240 may be larger than the second inner diameter w4 of the second via hole 320 in the second diffusive layer 220, the second diffusive layer 240 being farther from the substrate 110 than the second diffusive layer 220.

The second inner diameters w2 and w4 of the second via holes 340 and 320, respectively, may be larger than the inner diameters w1, w3, and w5 of the first via holes 350, 330, 310, respectively. The via hole 300 may be filled with the third diffusive material 125 having a third refractive index different from the first or second refractive index. The via hole 300 may be completely filled with the third diffusive material 125. Alternatively, part of the via hole 300 may remain unfilled.

The third diffusive material 125 may be an organic material used to form a color filter. The third diffusive material 125 may include organic materials for red (R), green (G), and blue (B) color filters corresponding to the overlying color filter layer 120. However, the kind of the third diffusive material 125 having a third refractive index different from the first or second refractive index is not limited thereto.

When viewed vertically, the cross-section of the transflective layer 200 includes a column X1 including the first diffusive layers 210, 230, and 250 and the second diffusive layers 220 and 240 having different refractive indices and alternately stacked, a column X2 including the first diffusive layer 250, the third diffusive material 125, the first diffusive layer 230, the third diffusive material 125, and the first diffusive layer 210 continuously arranged, and a column X3 including only the third diffusive material 125. The columns X1, X2, and X3 are arranged in a direction substantially perpendicular to one surface of the substrate 110, that is, in a vertical direction. As a result, the light having passed through the color filter layer 120 is repeatedly subjected to reflection and refraction while passing through the transflective layer 200 and the third diffusive material 125. In this case, the light changes direction at an angle not exceeding a critical angle where total internal reflection occurs, so that the quantity of light emitted outside the substrate 110 increases, and the light is emitted in directions not only perpendicular to the surface of the substrate 110 but may also be tilted to other angles from the surface of the substrate 110, thereby improving brightness efficiency according to a viewing angle.

Referring to FIG. 1A, FIG. 1B, FIG. 2, and FIG. 3, the via holes 350a, 350b, 350c, 350d, 350e, 350f, and 350g according to an exemplary embodiment of the present invention may have a hexagonal cross-section. The via holes 350a, 350b, 350c, 350d, 350e, 350f, and 350g may have a hexagonal prism shape. The via holes 350a, 350b, 350c, 350d, 350e, 350f, and 350g are spaced apart a predetermined distance d2 from adjacent via holes 350a, 350b, 350c, 350d, 350e, 350f, and 350g, forming periodically appearing regular triangles. The via holes 350a, 350b, 350c, 350d, 350e, 350f, and 350g positioned at vertices of the regular triangles are continuously arranged, providing a hexagonal cross-section having the via hole 250d disposed at its center. The via holes 350a, 350b, 350c, 350d, 350e, 350f, and 350g may be formed in the first diffusive layer 250.

A ratio of the inner diameter d1 of each of the via holes 350a, 350b, 350c, 350d, 350e, 350f, and 350g to the distance d2 between adjacent via holes 350a, 350b, 350c, 350d, 350e, 350f, and 350g may range from 3:2 to 2:1. In this embodiment, the first inner diameter d1 may be in a range of, for example, 3 to 6 µm, and the distance d2 may be in a range of, for example, 2 to 4 µm. In addition, a distance d3 ranging from one of the via holes 350a, 350b, 350c, 350d, 350e, 350f, and 350g positioned at vertices to the bottom side of each triangle may be in a range of, for example, 4.25 to 8.75 µm. Accordingly, the light is diffused while passing through the transflective layer 200 and the via holes 350a, 350b, 350c, 350d, 350e, 350f, and 350g, thereby improving the brightness efficiency and color reproducibility.

Figure 3:
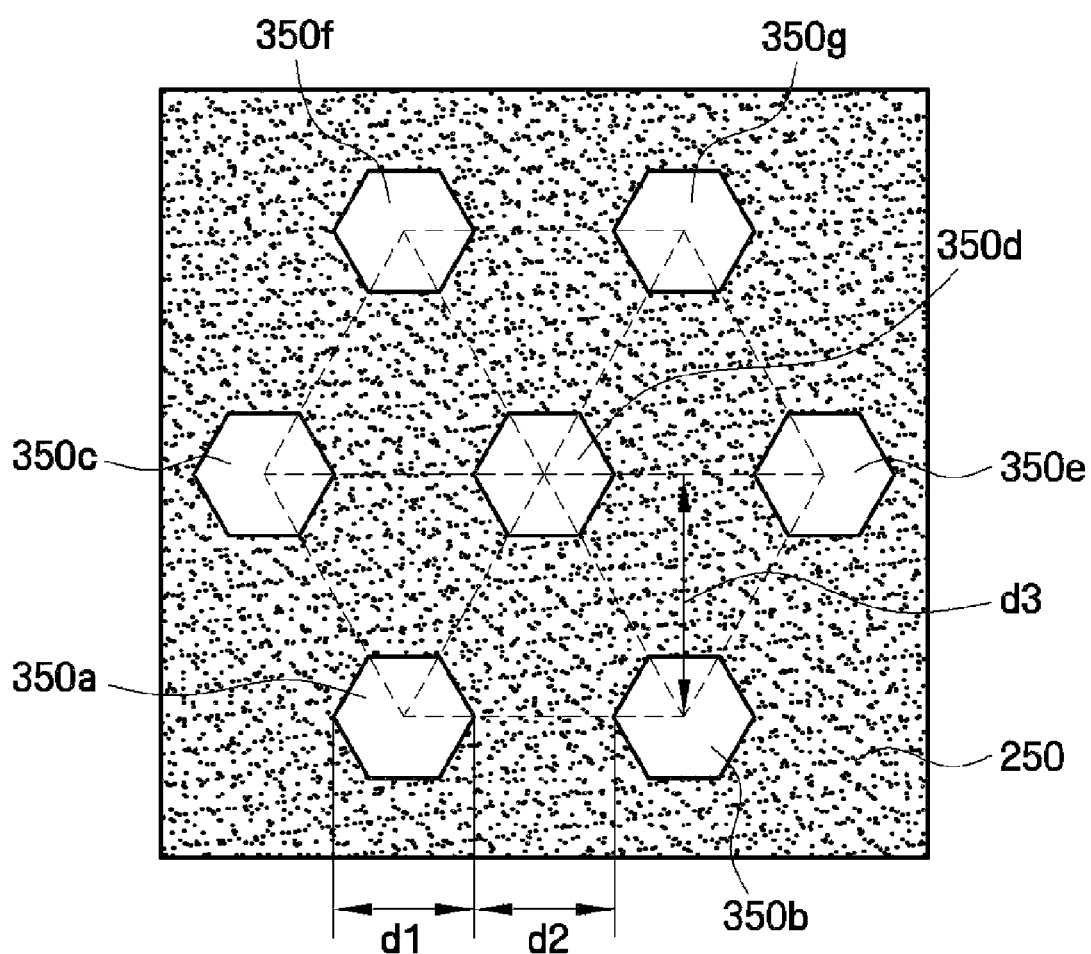
FIG. 3 is a horizontal cross-sectional view taken along line Y-Y' in FIG. 1B, showing the display device according to an exemplary embodiment of the present invention.
Figure 4:
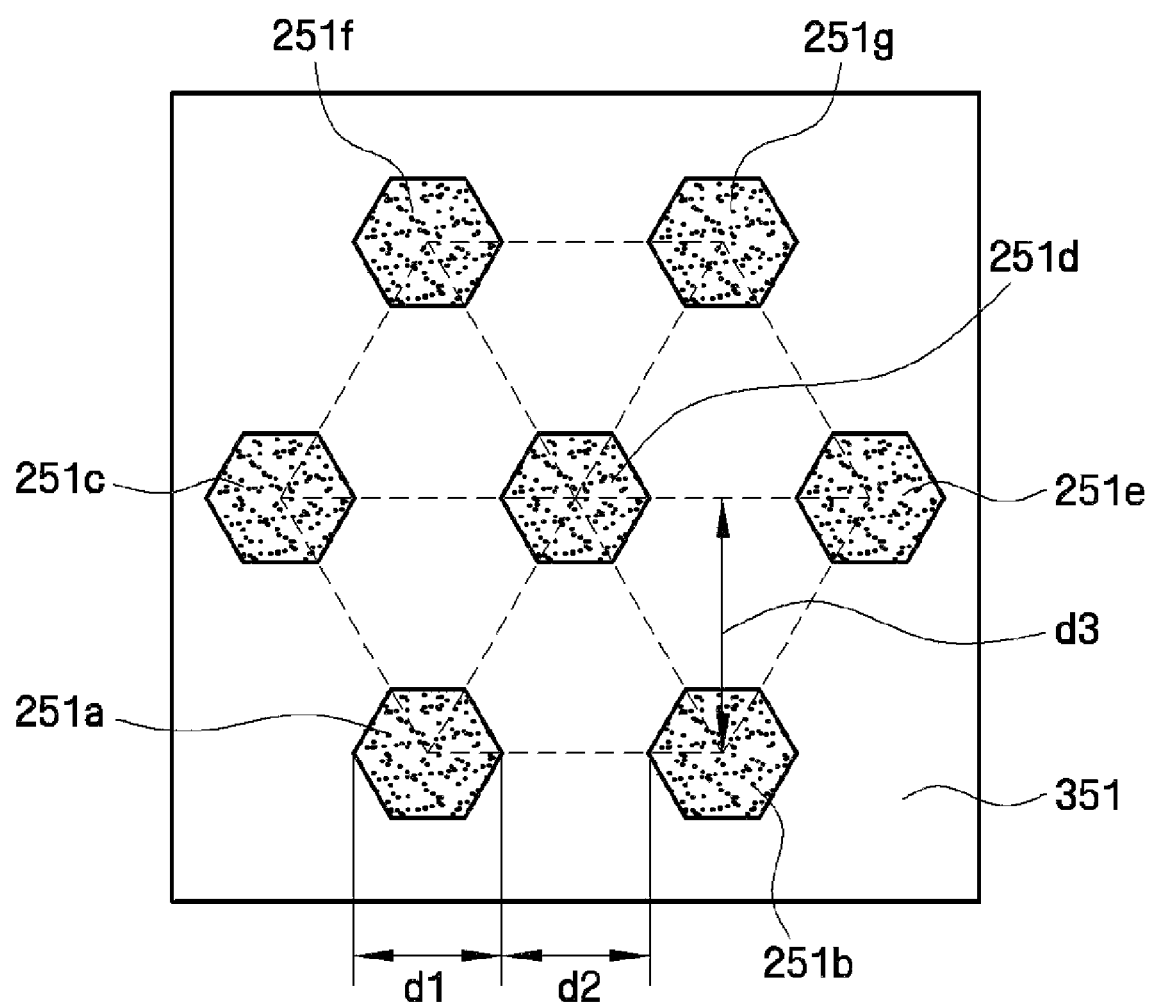
FIG. 4 is a horizontal cross-sectional view taken along line Y-Y' in FIG. 1B, showing the display device according to a first modified example of the exemplary embodiment of the present invention shown in FIG. 1A, FIG. 1B, FIG. 2, and FIG. 3.

Referring to FIG. 1B and FIG. 4, in the display device according to a first modified example of the exemplary embodiment shown in FIG. 1A, FIG. 1B, and FIG. 2, the arrangement of a via hole 351 and transflective layers 251a, 251b, 251c, 251d, 251e, 251f, and 251g is substantially the same as that of exemplary embodiment shown in FIG. 3. However, the arrangement of a via hole 351 and transflective layers 251a, 251b, 251c, 251d, 251e, 251f, and 251g may also be filled in an opposite position to that of the exemplary embodiment shown in FIG. 3. In other words, the transflective layers 251a, 251b, 251c, 251d, 251e, 251f, and 251g are arranged in a hexagonal prism, the via hole 351 is formed in a space outside the hexagonal prism, and a third diffusive material is distributed throughout the space. The via hole 351 according to the first modified example corresponds to an external area having a hexagonal prism shape, and having periodically appearing regular triangles spaced apart from each other at a predetermined distance.

Figure 5:
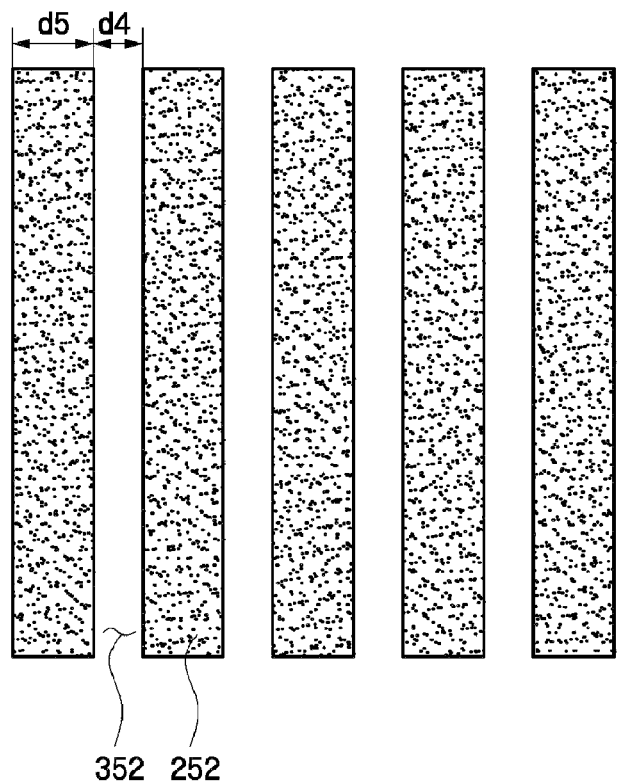
FIG. 5 is a horizontal cross-sectional view taken along line Y-Y' in FIG. 1B, showing the display device according to a second modified example of the exemplary embodiment of the present invention shown in FIG. 1A, FIG. 1B, FIG. 2, and FIG. 3.

Referring to FIG. 1B and FIG. 5, a via hole 352 according to the second modified example of the exemplary embodiment shown in FIG. 1A, FIG. 1B, and FIG. 2 may have a rectangular prism shape. The cross-sectional arrangement of the via hole 352 and a transflective layer 252 may have a periodically appearing stripe shape. A plurality of via holes 352 are spaced apart from one another by a predetermined distance d5, and the via hole 352 has a predetermined inner diameter d4.

Referring back to FIG. 1B, the color filter layer 120 is formed on the transflective layer 200. The color filter layer 120 may include red (R), green (G), and blue (B) organic materials. The color filter layer 120 may be formed of red (R), green (G), and blue (B) organic materials that are periodically arranged. The red (R), green (G), and blue (B) organic materials have a third refractive index different from the first or second refractive indices. While the present exemplary embodiment shows that the color filter layer 120 has red, green, and blue colors, the color filter layer 120 according to the invention may further include a white organic material. The third diffusive material 125 filling the via hole 300 may be the same material as that of the color filter layer 120.

The overcoat layer 130 is disposed on the color filter layer 120. The overcoat layer 130 planarizes the top surface of the color filter layer 120. The overcoat layer 130 may be made of an organic material for forming an overcoat layer such as polyimide, polyamide, acryl resin, benzocyclobutene (BCB), and phenolic resin.

The anode electrode 140, the light-emitting layer 150, and the cathode electrode 160 sequentially disposed on the overcoat layer 130.

The anode layer 140 may be made of a metal or metal oxide having a high work function. Examples of the material forming the anode layer 140 may include indium tin oxide (ITO), indium zinc oxide (IZO), and so on. Since ITO or IZO has a high work function and is a transparent material, it may be used for a rear-surface emitting OLED that emits light to a rear surface of the substrate 110.

The anode layer 140 has electrically separated areas by pixel, and the respective areas are independently driven by at least one switching element (not shown), for example, at least one TFT.

The light-emitting layer 150 is formed on the anode layer 140 in an overlapping manner. As shown in FIG. 1B, for example, the light-emitting layer 150 may be formed to completely overlap the anode layer 140. The light-emitting layer 150 may be made of a low-molecular weight material such as aluminum tris (8-hydroxyquinoline) (Alq$_3$), anthracene, cyclopentadiene, ZnPBO, bis(8-hydroxyquinaldine)aluminum biphenoxide (BAlq), and (4,4'-bis(2,2-diphenylethen-1-yl)-diphenyl (DPVBi). Alternatively, the light-emitting layer 150 may be made of a polymer material such as polythiophene (PT), poly (p-phenylenevinylene) (PPV), polyphenylene (PPP), and derivatives of these materials. In the present exemplary embodiment, the light-emitting layer 150 may include a white light-emitting layer. Alternatively, the light-emitting layer 150 may include red, green, and blue light-emitting layers.

The cathode layer 160 is formed on the light-emitting layer 150. The cathode layer 160 may be made of a material having a work function lower than the anode layer 140. The cathode layer 160 may be made of a highly reflective material such as MgAg, CaAl, or the like. The same voltage is applied to the cathode layer 160, unlike the anode layer 140, regardless of pixel.

Although not shown, a hole transporting layer (not shown) may further be formed between the anode layer 140 and the light-emitting layer 150. A hole injection layer (not shown) may further be formed between the anode layer 140 and the hole transporting layer. Similarly, an electron transporting layer may further be formed between the cathode layer 160 and the light-emitting layer 150. An electron injection layer (not shown) may further be formed between the cathode layer 160 and the electron transporting layer.

The encapsulation substrate 170 may be formed on the cathode layer 160. The encapsulation substrate 170 may be made of a transparent insulating material such as glass, plastic, or the like. In the present exemplary embodiment, the invention has been described with regard to a rear-surface emitting OLED display device by way of example. In the present invention, the encapsulation substrate 170 may be made of an opaque material such as a metal as well as a transparent material.

The encapsulation substrate 170 may be spaced apart a predetermined distance from the cathode layer 160. A moisture-absorbing agent may be disposed in a space 190 between the encapsulation substrate 170 and the cathode layer 160. When the encapsulation substrate 170 is made of plastic foil, the encapsulation substrate 170 may not be spaced apart from the cathode layer 160. In order to decrease the ability of moisture to permeate the encapsulation substrate 170, the encapsulation substrate 170 may be an insulating layer composed of an inorganic material and an organic material.

In the present exemplary embodiment, the invention has been described with regard to a rear-surface emitting OLED display device, but the invention may also be applied to a front-surface emitting OLED display device. Undefined reference numeral 100 denotes a unit element of a display device except for the encapsulation substrate 170 and the substrate 110.

Figure 6:
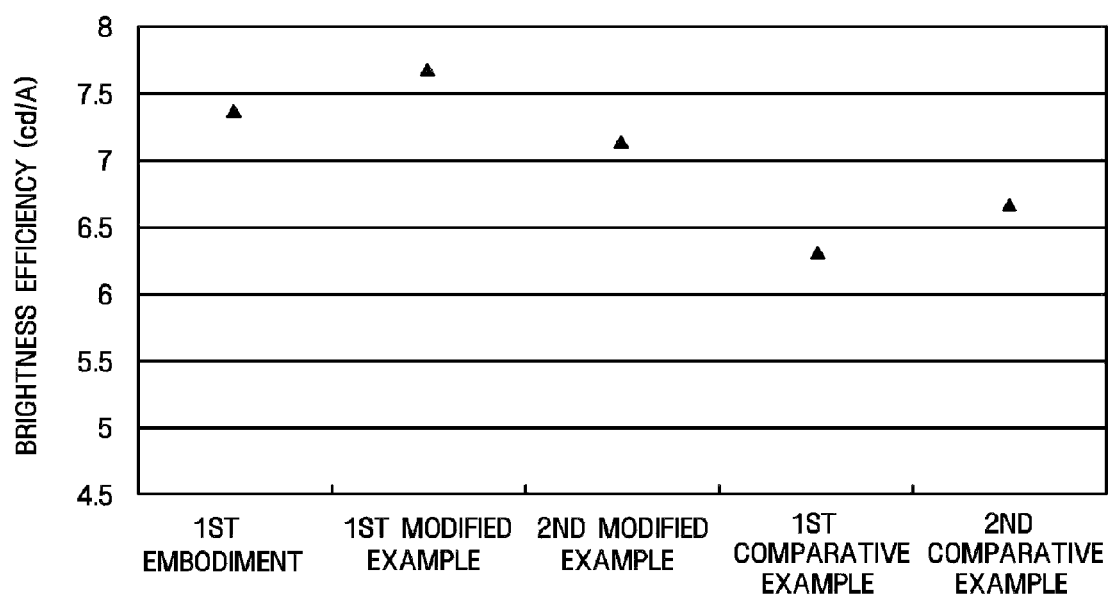
FIG. 6 is a graph showing brightness efficiency of the display device according to exemplary embodiments of the present invention shown in FIG. 1A, FIG. 1B, FIG. 2, FIG. 3, FIG. 4, and FIG. 5, in comparison with that of a display device according to a comparative example.

Hereinafter, brightness efficiency of the display device according to the exemplary embodiment of the present invention shown in FIG. 1A, FIG. 1B, FIG. 2, FIG. 3, FIG. 4, and FIG. 5 compared with a display device according to a comparative example will be described with reference to FIG. 6 and FIG. 7. FIG. 6 is a graph showing brightness efficiency of the display device according to the exemplary embodiment of the present invention shown in FIG. 1A, FIG. 1B, FIG. 2, FIG. 3, FIG. 4, and FIG. 5 compared with that of a display device according to a comparative example, and FIG. 7 is a graph showing average brightness of the display device according to the exemplary embodiment of the present invention shown in FIG. 1A, FIG. 1B, FIG. 2, FIG. 3, FIG. 4, and FIG. 5 is compared with that of a display device according to a comparative example.

Referring to FIG. 6, the display devices according to the exemplary embodiment shown in FIG. 1A, FIG. 1B, FIG. 2, and FIG. 3, and the first and second modified examples of the exemplary embodiment shown in FIG. 4 and FIG. 5 have relatively high brightness efficiency, e.g., 7 cd/A or higher, while the display devices according to first and second comparative examples have relatively low brightness efficiency. The first comparative example illustrates a case where no via hole is formed in the transflective layer disposed on a substrate. The second comparative example illustrates a case where the transflective layer disposed on a substrate is a single-layered transflective layer made of a single material, e.g., oxide, without a transflective layer made of silicon nitride.

Figure 7:
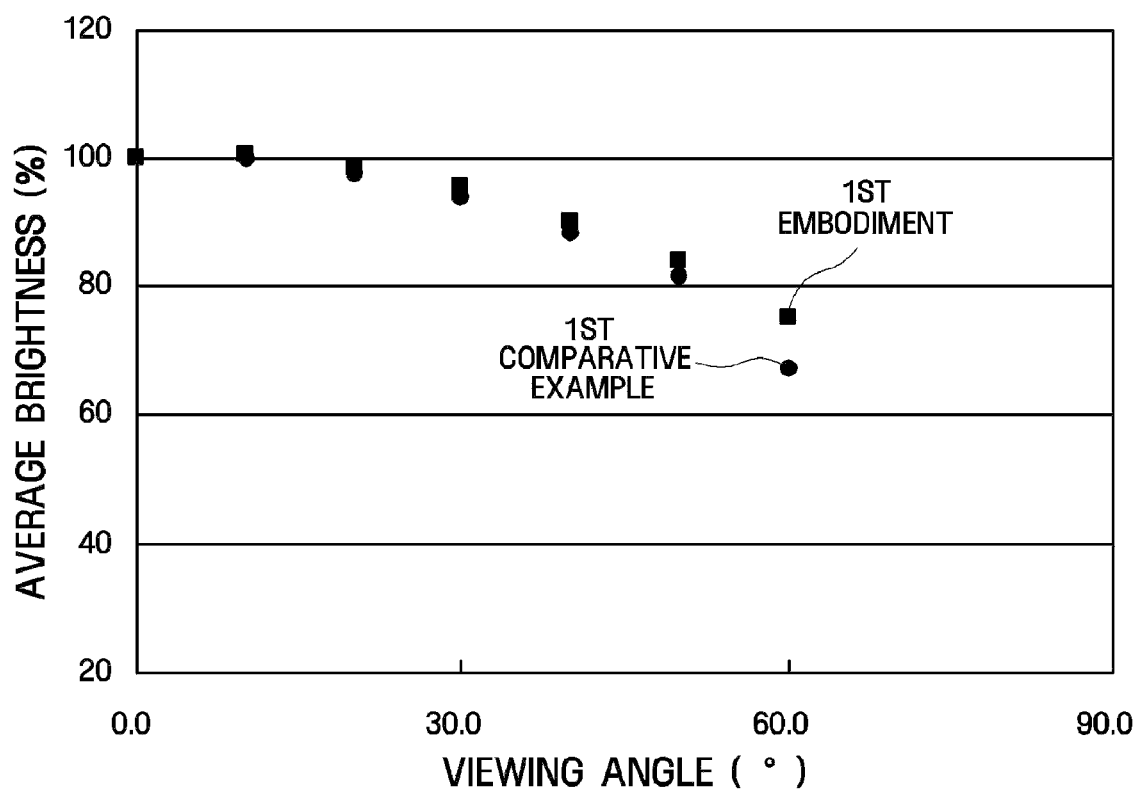
FIG. 7 is a graph showing average brightness of the display device according to exemplary embodiments of the present invention shown in FIG. 1A, FIG. 1B, FIG. 2, FIG. 3, FIG. 4, and FIG. 5, in comparison with that of a display device according to a comparative example.

Referring to FIG. 7, in the exemplary embodiment shown in FIG. 1A, FIG. 1B, FIG. 2, and FIG. 3, a reduction in the average brightness due to an increased viewing angle is relatively smaller than in the comparative example. The average brightness of the display device according to the exemplary embodiment shown in FIG. 1A, FIG. 1B, FIG. 2, and FIG. 3 is greater than that of a display device according to the first comparative example in which periodically appearing via holes are not formed.

Hereinafter, a method of fabricating a display device according to an exemplary embodiment of the present invention will be described in detail with reference to FIG. 8, FIG. 9, FIG. 10, FIG. 11, FIG. 12, FIG. 13, and FIG. 14. FIG. 8, FIG. 9, FIG. 10, FIG. 11, FIG. 12, FIG. 13, and FIG. 14 are cross-sectional views showing processing steps of a method of fabricating a display device according to an exemplary embodiment of the present invention. For brevity, components each having the same function for describing the following embodiments are respectively identified by the same reference numerals as those shown in FIG. 1A, FIG. 1B, and FIG. 2, and their repetitive description will not be made or briefly made.

Figure 8:
FIG. 8, FIG. 9, FIG. 10, FIG. 11, FIG. 12, FIG. 13, and FIG. 14 are cross-sectional views showing steps of a method of fabricating a display device according to an exemplary embodiment of the present invention.

Referring to FIG. 8, a substrate 110 is provided and a transflective layer 200 is formed on the substrate 110. Forming the transflective layer 200 includes alternately forming first diffusive layers 210, 230, and 250 having a first refractive index, and second diffusive layers 220 and 240 having a second refractive index different from the first refractive index. In the present exemplary embodiment, 2.5 pairs of layers selected from the first diffusive layers 210, 230, and 250 and from the second diffusive layers 220 and 240 are stacked sequentially one above another. However, the number of stacked multiple layers of the first diffusive layers 210, 230, and 250 and the second diffusive layers 220 and 240 is not limited to the number shown in the present exemplary embodiment.

The first diffusive layers 210, 230, and 250 may be formed by depositing a silicon oxide layer using, for example, Chemical Vapor Deposition (CVD). The second diffusive layers 220 and 240 may be formed by depositing a silicon nitride layer using, for example, CVD.

Figure 9:
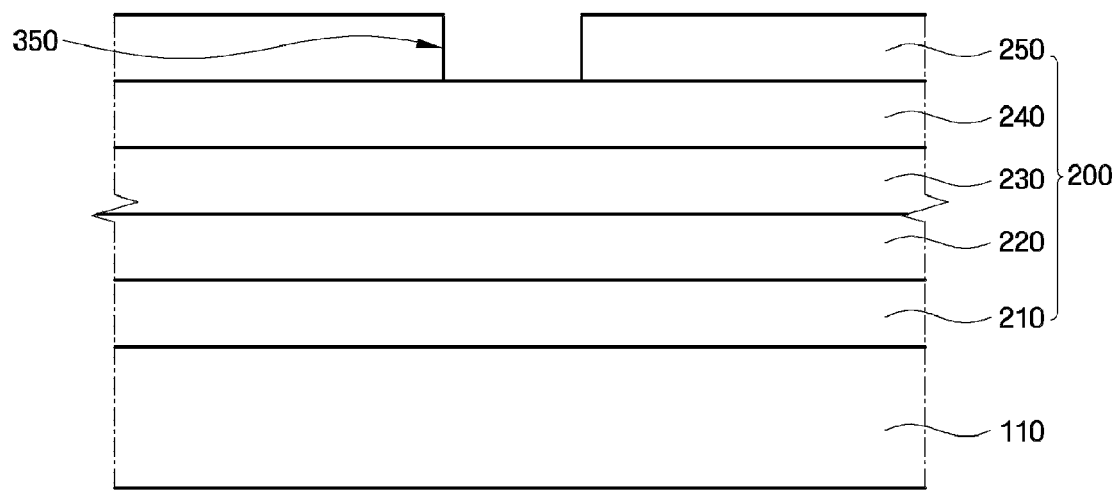

Next, referring to FIG. 9, the topmost transflective layer 200 may be a first diffusive layer 250. The first via hole 350 is formed to penetrate the first diffusive layer 250 by etching the first diffusive layer 250. The first diffusive layer 250 may be etched using a first etching gas having a predetermined etch rate with respect to the second diffusive layer 240. In a case where the first diffusive layer 250 is a silicon oxide layer and the second diffusive layer 240 is a silicon nitride layer, the first etching gas may be $C_4H_8+H_2$. Alternately forming multiple layers of the first via hole 350 may be performed using an etch mask in which openings having a first width are arranged periodically in a second interval. A ratio of the first width to the second interval may range from 3:2 to 2:1.

Figure 10:
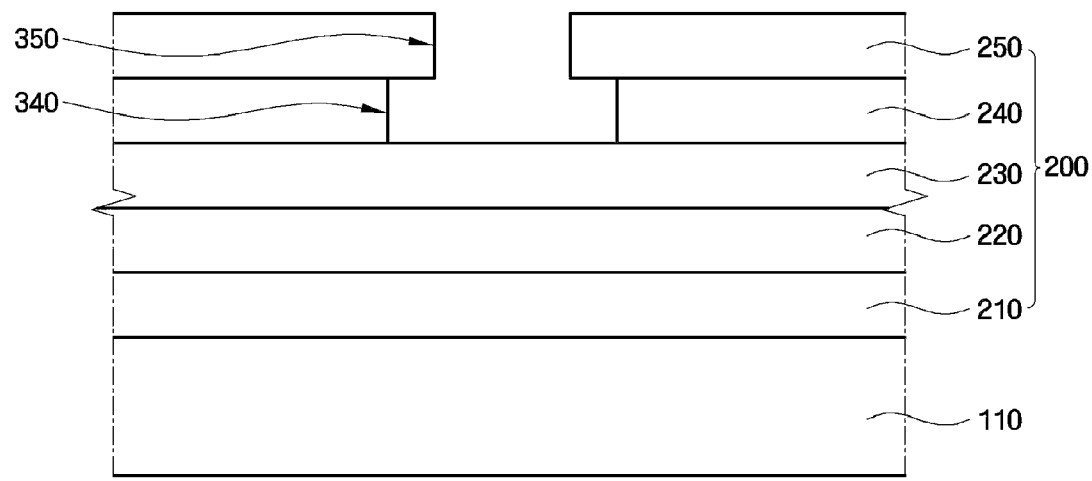

Referring to FIG. 10, the first via hole 340 is formed to penetrate the second diffusive layer 240 by etching the second diffusive layer 240. The second diffusive layer 240 may be etched using a second etching gas having a predetermined etch rate with respect to the second diffusive layer 250. In a case where the first diffusive layer 250 is a silicon oxide layer and the second diffusive layer 240 is a silicon nitride layer, the second etching gas may be $CF_4+O_2$. When etching the second diffusive layer 240, the second diffusive layer 240 is overetched by extending an etch time. Since the second etching gas has a predetermined etch rate with respect to the second diffusive layer 250, extending the etch time allows the second diffusive layer 240 to be overetched in a horizontal direction. Accordingly, a second inner diameter of the first via hole 340 is larger than a first inner diameter of the first via hole 350.

Figure 11:
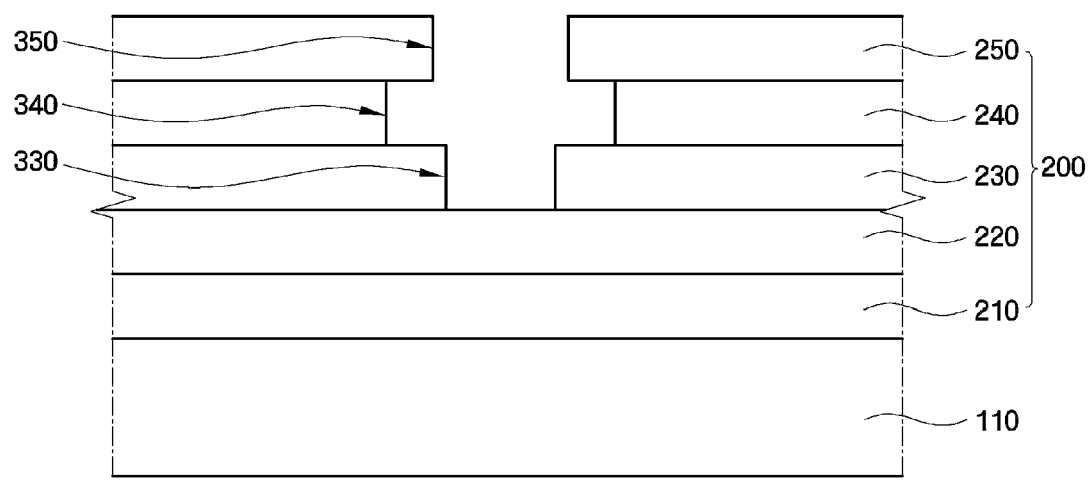

Referring to FIG. 11, the first via hole 330 is formed by etching the first diffusive layer 230 using the first etching gas described with reference to FIG. 9. In this case, since the topmost first via hole 350, is exposed to the first etching gas for a long time, the first via hole 350 may have an inner diameter larger than that of the first via hole 330.

Figure 12:
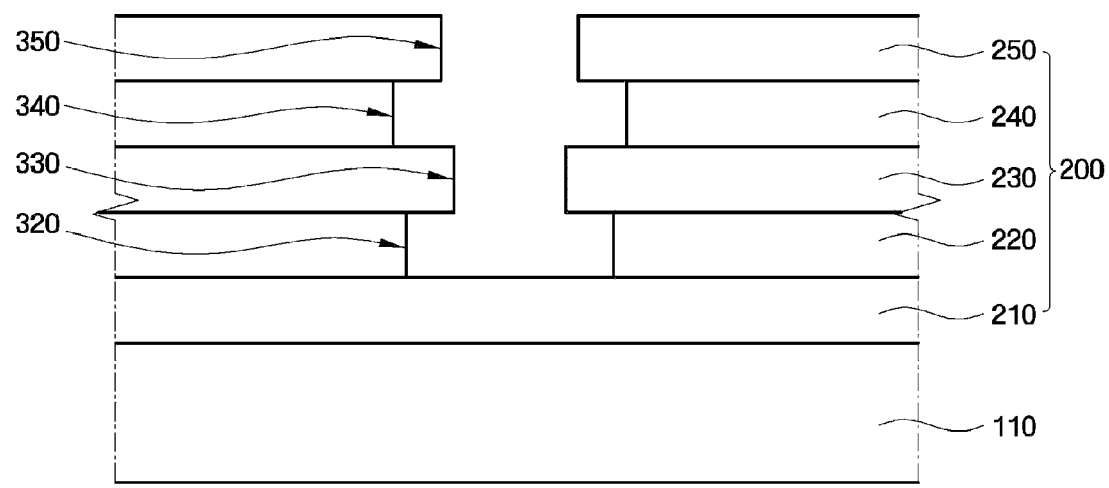

Referring to FIG. 12, the second via hole 320 is formed by etching the second diffusive layer 220 using the second etching gas described with reference to FIG. 10. In this case, since the second via hole 340 is exposed to the second etching gas for a long time, the second via hole 340 may have an inner diameter larger than that of the second via hole 320.

Figure 13:
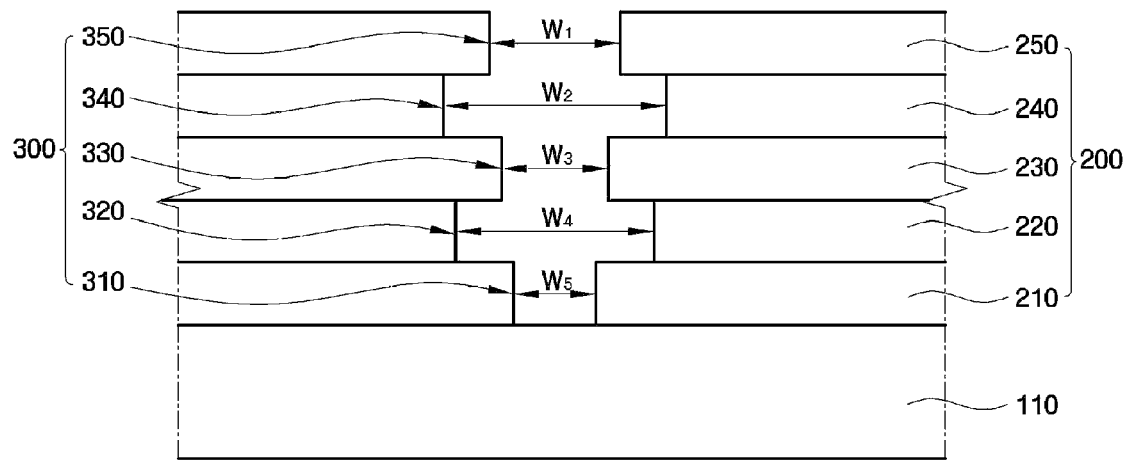

Referring to FIG. 13, the first via hole 310 is formed by etching the first diffusive layer 210 using the first etching gas described with reference to FIG. 9 and FIG. 11. In this case, since the topmost first via hole 350 is exposed to the first etching gas for a long time, it may have an inner diameter larger than that of the first via hole 330, which has an inner diameter larger than that of the first via hole 310. That is to say, the first inner diameter w1 of the first via hole 350 in the first diffusive layer 250 positioned farthest from the substrate 110 is largest, the first inner diameter w5 of the first via hole 310 in the first diffusive layer 210 positioned nearest to the substrate 110 is smallest, and the first inner diameter w3 of the first via hole 330 between the first via hole 350 and the first via hole 310 has an intermediate size.

Meanwhile, the second inner diameter w2 of the second via hole 340 positioned farthest from the substrate 110 is largest, and the second inner diameter w4 of the second via hole 320 positioned nearest to the substrate 110 is smallest. The second inner diameters w2 and w4 are made larger than the inner diameters w1, w3 and w5 by overetching the first second diffusive layers 220 and 240, which is accomplished using the same method as described above.

As described above, forming the multiple via holes includes alternately etching the first diffusive layers 210, 230, and 250 using a first etching gas having a predetermined etch rate with respect to the second diffusive layers 220 and 240 and etching the second diffusive layers 220 and 240 using a second etching gas having a predetermined etch rate with respect to the first diffusive layers 210, 230, and 250. The etching process using the first etching gas and the second etching gas is performed as many times as there are number of layers including the first diffusive layers 210, 230, and 250 and the second diffusive layers 220 and 240.

Figure 14:
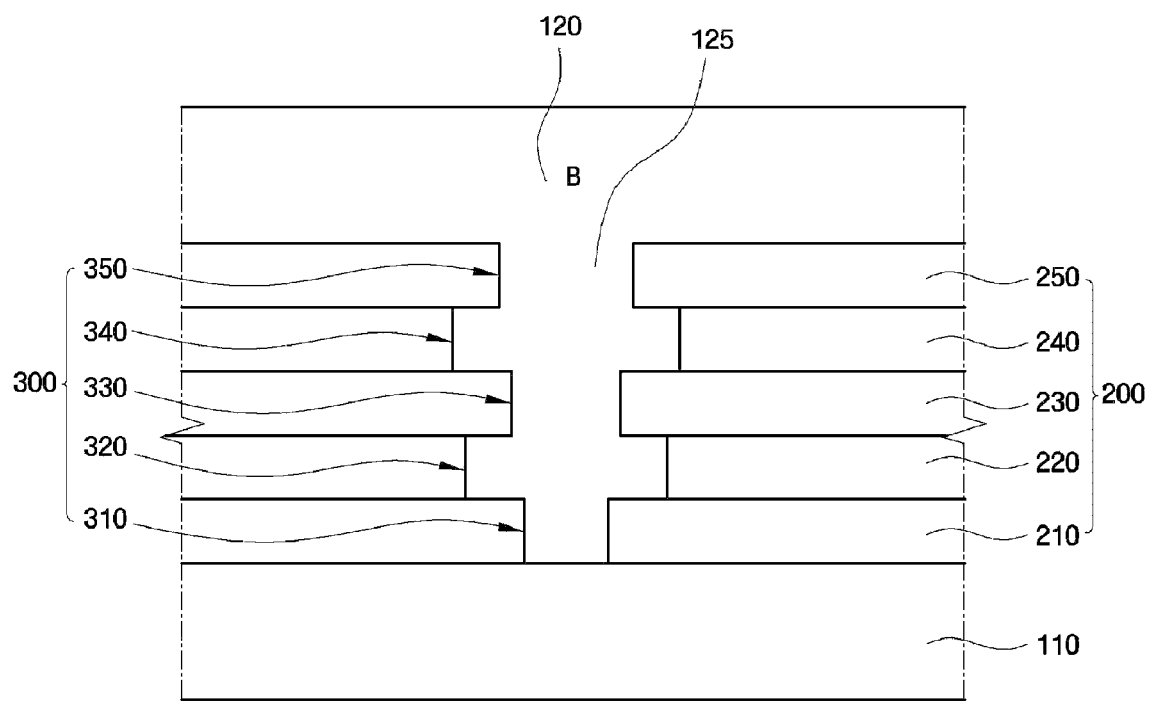

Referring to FIG. 14, after forming the via hole 300, a color filter layer 120 made of a color organic material, having a third refractive index different from the first or second refractive index, is formed directly on the first transflective layer 250. The color filter layer 120 may be formed using a known technique such as spin coating, ink-jet technique, or CVD. In this case, the via hole 300 is filled with the color organic material.

Referring back to FIG. 1B, the overcoat layer 130 is formed on the color filter layer 120 using, for example, spin coating.

Next, the anode layer 140 is formed using, for example, sputtering. Then, the light-emitting layer 150 is formed on the anode layer 140, and the cathode layer 160 is formed on the light-emitting layer 150.

Referring to FIG. 1A, the encapsulation substrate 170 is disposed on the cathode layer 160, and the encapsulation substrate 170 and the substrate 110 are adhered to each other using a sealing member 180, thereby completing the display device according to the present exemplary embodiment.

Figure 15:
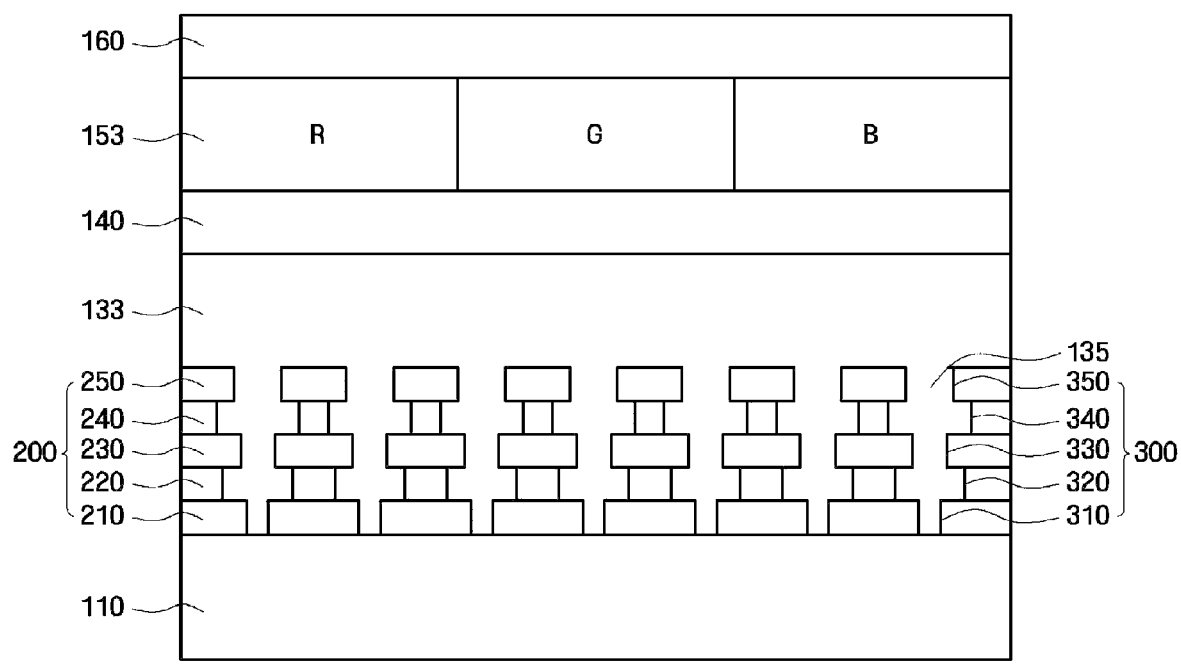
FIG. 15 is a vertical cross-sectional view of FIG. 1A, schematically showing the display device according to an exemplary embodiment of the present invention.

Hereinafter, a display device according to an exemplary embodiment of the present invention will be described in detail with reference to FIG. 15. FIG. 15 is a vertical cross-sectional view schematically showing the display device shown in FIG. 1A according to an exemplary embodiment of the present invention.

Referring to FIG. 15, a color filter layer is not formed on the transflective layer 200 according to the present exemplary embodiment, and an overcoat layer 133 made of an organic material for forming a color filter, having a fourth refractive index similar to the first or the second refractive index, is formed directly on the first transflective layer 250.

An organic material 135 for forming an overcoat layer fills the via hole 300, which induces diffusion of light together with the transflective layer 200, which may thereby improve the brightness of the display device by providing an increased viewing angle.

Figure 16:
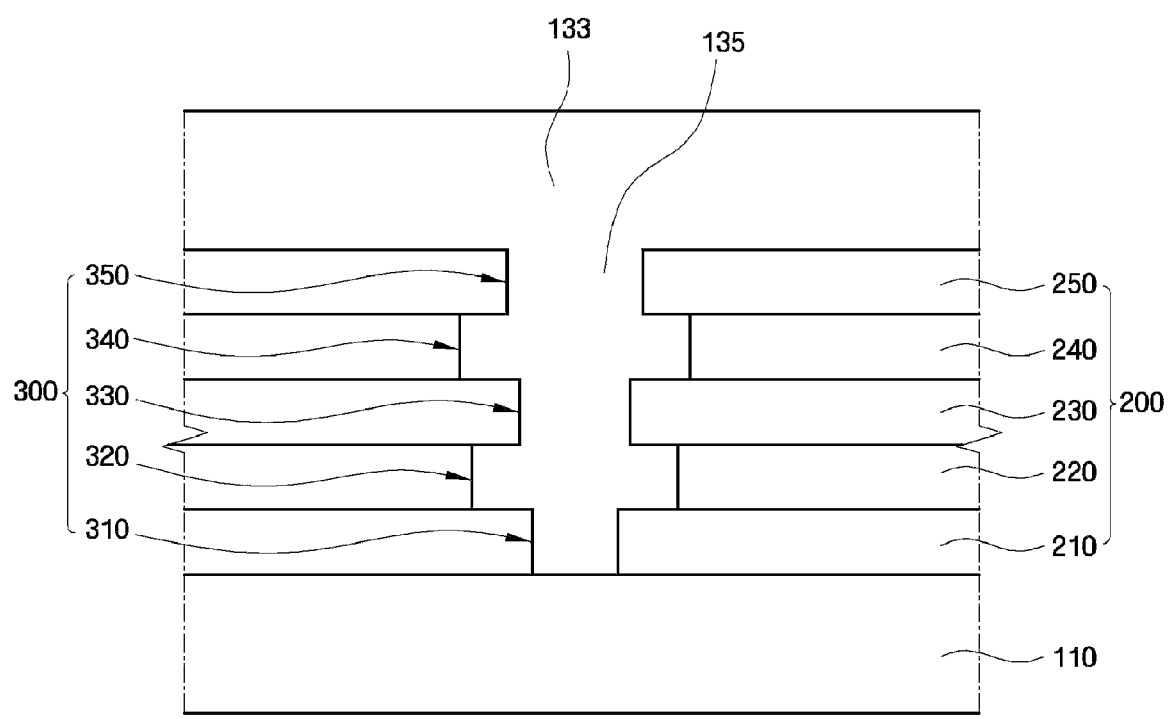
FIG. 16 is a cross-sectional view showing a method of fabricating a display device according to an exemplary embodiment of the present invention.

Hereinafter, a display device according to an exemplary embodiment of the present invention will be described in detail with reference to FIG. 8, FIG. 9, FIG. 10, FIG. 11, FIG. 12, FIG. 13, FIG. 15, and FIG. 16. FIG. 16 is a cross-sectional view showing a method of fabricating a display device according to an exemplary embodiment of the present invention.

First, the transflective layer 200 and the via hole 300 are formed using the processing steps described with reference to FIG. 8, FIG. 9, FIG. 10, FIG. 11, FIG. 12, and FIG. 13.

Next, referring to FIG. 16, the overcoat layer 133 made of an organic material for forming a color filter is formed directly on the transflective layer 200. In this case, the via hole 300 is filled with the organic material 135 for forming an overcoat layer.

Referring to FIG. 15, an anode layer 140 is formed on the overcoat layer 133, and a light-emitting layer 153 made of red (R), green (G), and blue (B) organic materials is formed on the anode layer 140. Next, a cathode layer 160 is formed on the light-emitting layer 153, thereby completing a display panel.

Figure 17:
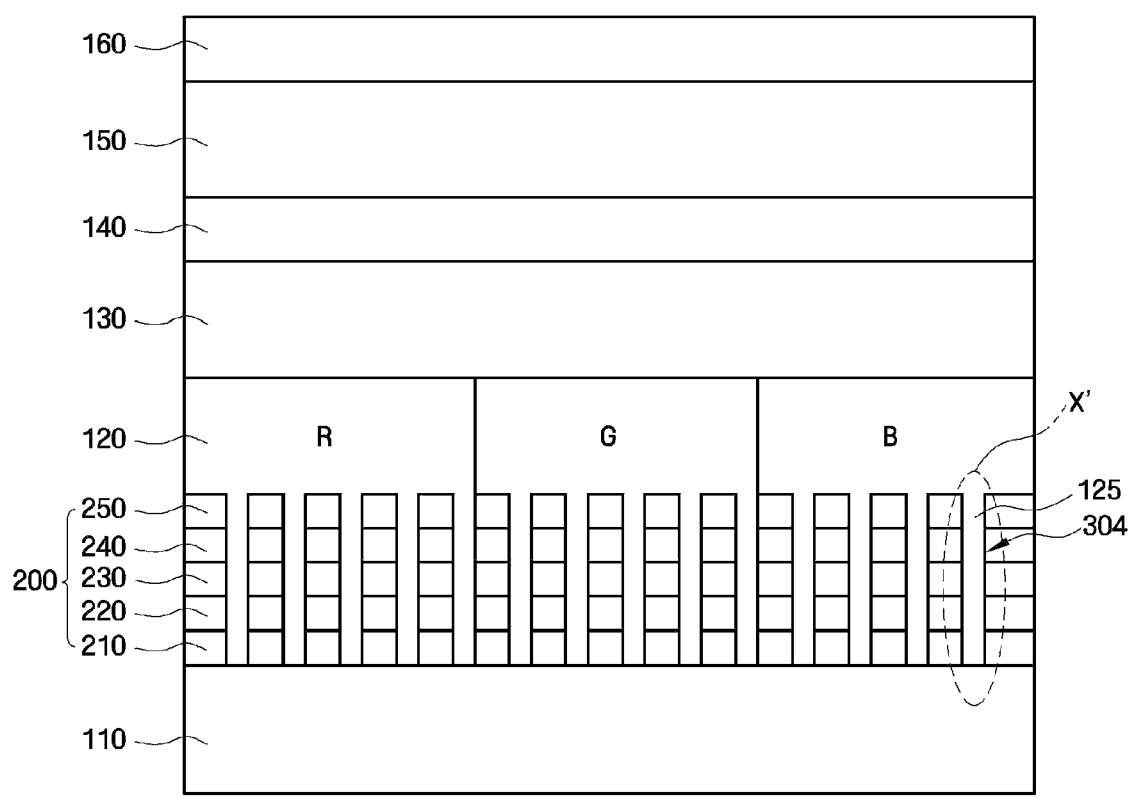
FIG. 17 is a vertical cross-sectional view of FIG. 1A, schematically showing the display device according to an exemplary embodiment of the present invention.

Hereinafter, a display device according to an exemplary embodiment of the present invention will be described in detail with reference to FIG. 17 and FIG. 18. FIG. 17 is a vertical cross-sectional view schematically showing the display device shown in FIG. 1A, according to the exemplary embodiment, and FIG. 18 is an enlarged cross-sectional view showing a portion 'X' in FIG. 17.

Figure 18:
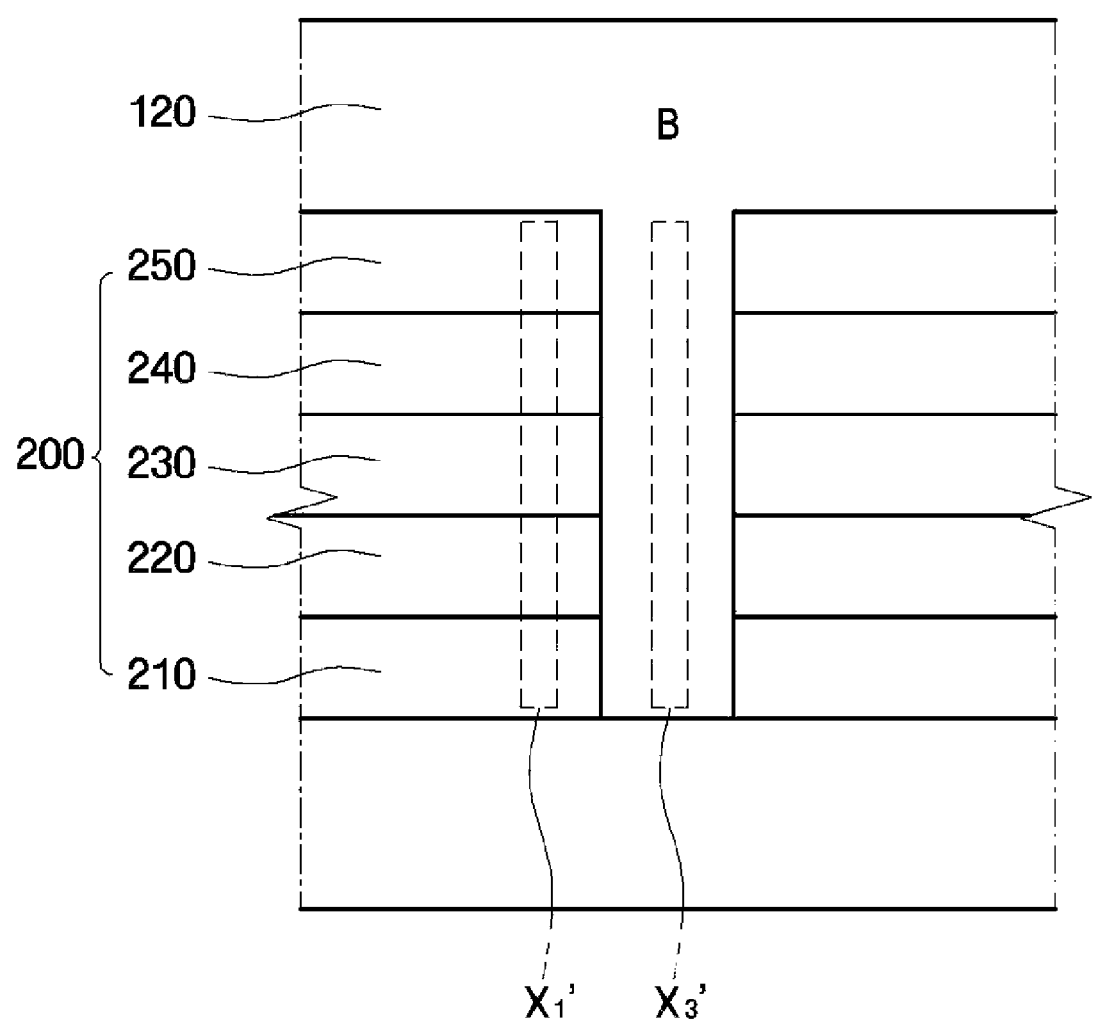
FIG. 18 is an enlarged cross-sectional view showing a portion 'X' in FIG. 17.

Referring to FIG. 17 and FIG. 18, a via hole 304 according to the present exemplary embodiment has a uniform inner diameter. That is to say, a second inner diameter of a second via hole formed in each of second diffusive layers 220 and 240 is substantially the same as a first inner diameter of a first via hole formed in each of first diffusive layers 210, 230, and 250.

The via hole 300, having a third refractive index different from the first or second refractive index, is filled with the third diffusive material 125. In the present exemplary embodiment, the third diffusive material may be an organic material used to form a color filter.

Referring to FIG. 18, when viewed vertically, the cross-section of the transflective layer 200 includes a column X1' including the first diffusive layers 210, 230, and 250 and the second diffusive layers 220 and 240 having different refractive indices and alternately stacked, and a column X3' including only the third diffusive material 125. The columns X1' and X3' are arranged in a direction substantially parallel to one surface of the substrate 110, that is, in a horizontal direction. As a result, the light having passed through the color filter layer 120 is repeatedly subjected to reflection and refraction while passing through the transflective layer 200 and the third diffusive material 125, and the quantity of light emitted outside the substrate 110 increases, and the light is emitted in a direction tilted to other angles from the surface of the substrate 110, thereby improving brightness efficiency according to a viewing angle.

Hereinafter, a method of fabricating a display device according to an exemplary embodiment of the present invention will be described in detail with reference to FIG. 17, FIG. 19 and FIG. 20.

Figure 19:
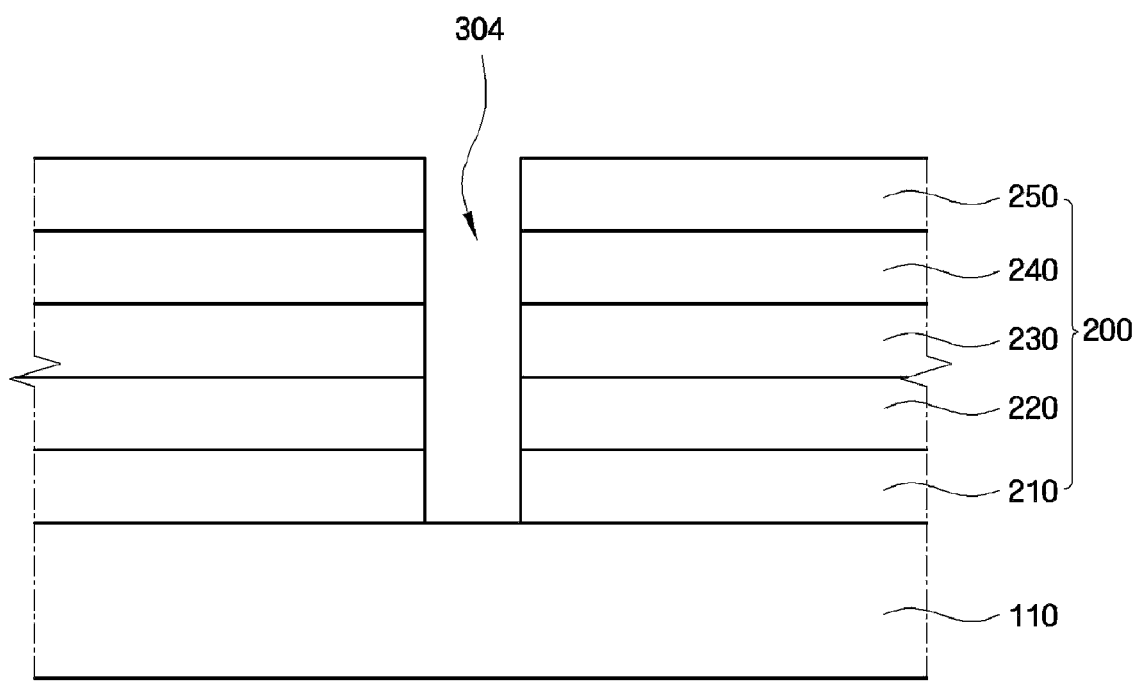
FIG. 19 and FIG. 20 are cross-sectional views showing a method of fabricating a display device according to an exemplary embodiment of the present invention.

Referring to FIG. 19, a substrate 110 is provided and a transflective layer 200 is formed on the substrate 110. Forming the transflective layer 200 includes alternately forming first diffusive layers 210, 230, and 250 having a first refractive index, and second diffusive layers 220 and 240 having a second refractive index different from the first refractive index.

Next, the first diffusive layers 210, 230 and 250 and the second diffusive layers 220 and 240 are alternately etched using an etching gas having a predetermined etch rate with respect to the second diffusive layer 240. In the present exemplary embodiment, the via hole 300 is formed in each of the first diffusive layers 210, 230, and 250 and the second diffusive layers 220 and 240 of the transflective layer 200 to have a uniform inner diameter.

Figure 20:
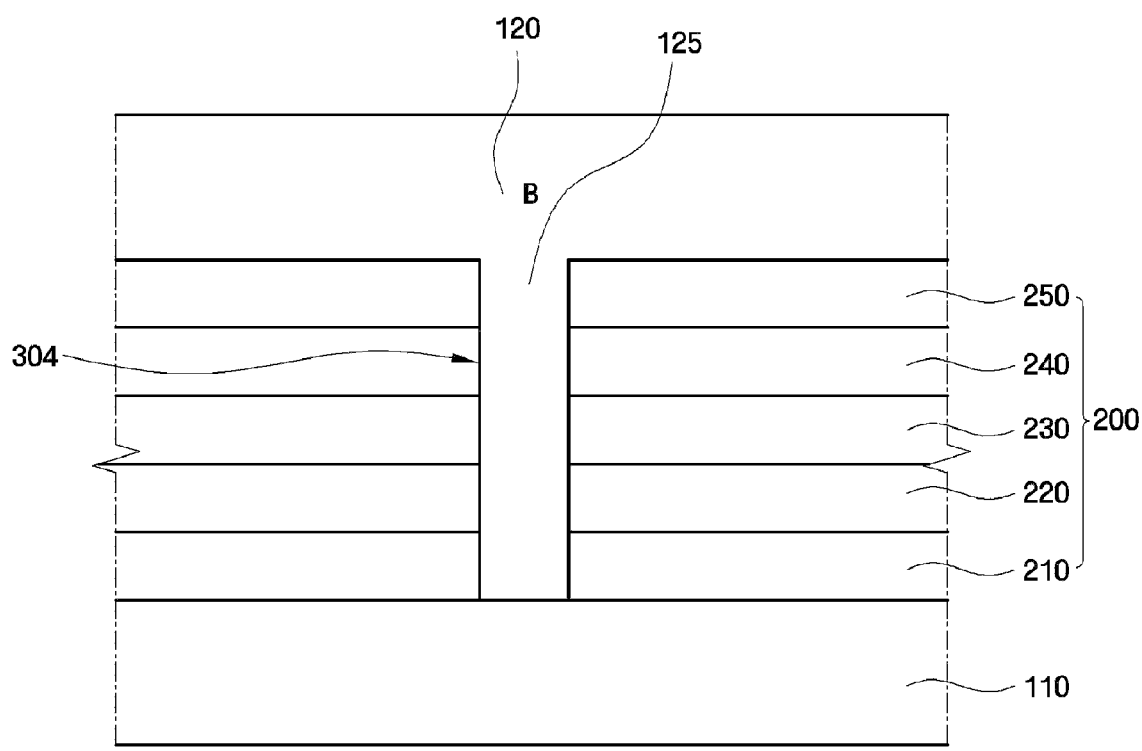

Next, referring to FIG. 20, a color filter layer 120 made of a color organic material 125, for forming a color filter having a third refractive index different from the first or the second refractive index, is formed directly on the first transflective layer 250. A via hole 300 having a uniform inner diameter is filled with the color organic material 125.

Referring back to FIG. 17, an overcoat layer 130, an anode layer 140, a light-emitting layer 150, and a cathode layer 160 are sequentially formed on the color filter layer 120, thereby completing a display panel.

Figure 21:
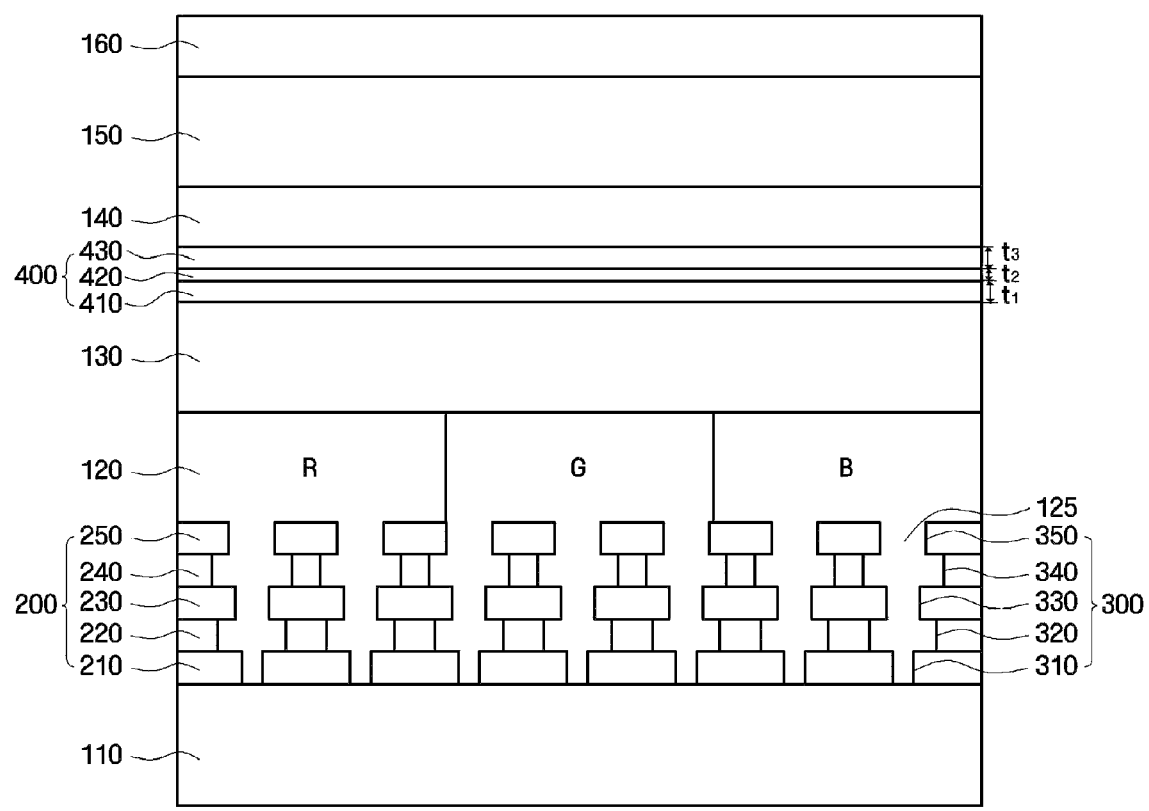
FIG. 21 is a vertical cross-sectional view of FIG. 1A, schematically showing the display device according to an exemplary embodiment of the present invention.

Hereinafter, a display device according to an exemplary embodiment of the present invention will be described in detail with reference to FIG. 21. FIG. 21 is a vertical cross-sectional view schematically showing the display device shown in FIG. 1A according to an exemplary embodiment of the present invention.

The present exemplary embodiment is substantially the same as the exemplary embodiment shown in FIG. 1A, FIG. 1B, FIG. 2, and FIG. 3, except that a refraction layer 400 is formed on the overcoat layer 130.

The refraction layer 400 includes first refractive layers 410 and 430 having a third refractive index, and a second refractive layer 420 having a fourth refractive index. The third and fourth refractive indices may be substantially the same as or different from the first and second refractive indices. The first refractive layers 410 and 430 may have first thicknesses t1 and t3, and the second refractive layer 420 may have a second thickness t2. The first thicknesses t1 and t3 may be different from the second thickness t2. The first thicknesses t1 and t3 may be greater than the second thickness t2. In the present exemplary embodiment, the first thicknesses t1 and t3 appear as having substantially the same thickness as each other. Alternatively the first thicknesses t1 and t3 may have a different thickness from each other.

The first refractive layers 410 and 430 may contain silicon oxide ($SiO_x$), and the second refractive layer 420 may contain silicon nitride ($SiN_x$).

According to the present exemplary embodiment, the brightness of light emitted towards the front of the display device may be improved by adjusting the thickness of the refraction layer 420. In addition, the brightness may be increased by providing an increased viewing angle using the transflective layer 200 disposed on the substrate 110.

Figure 22:
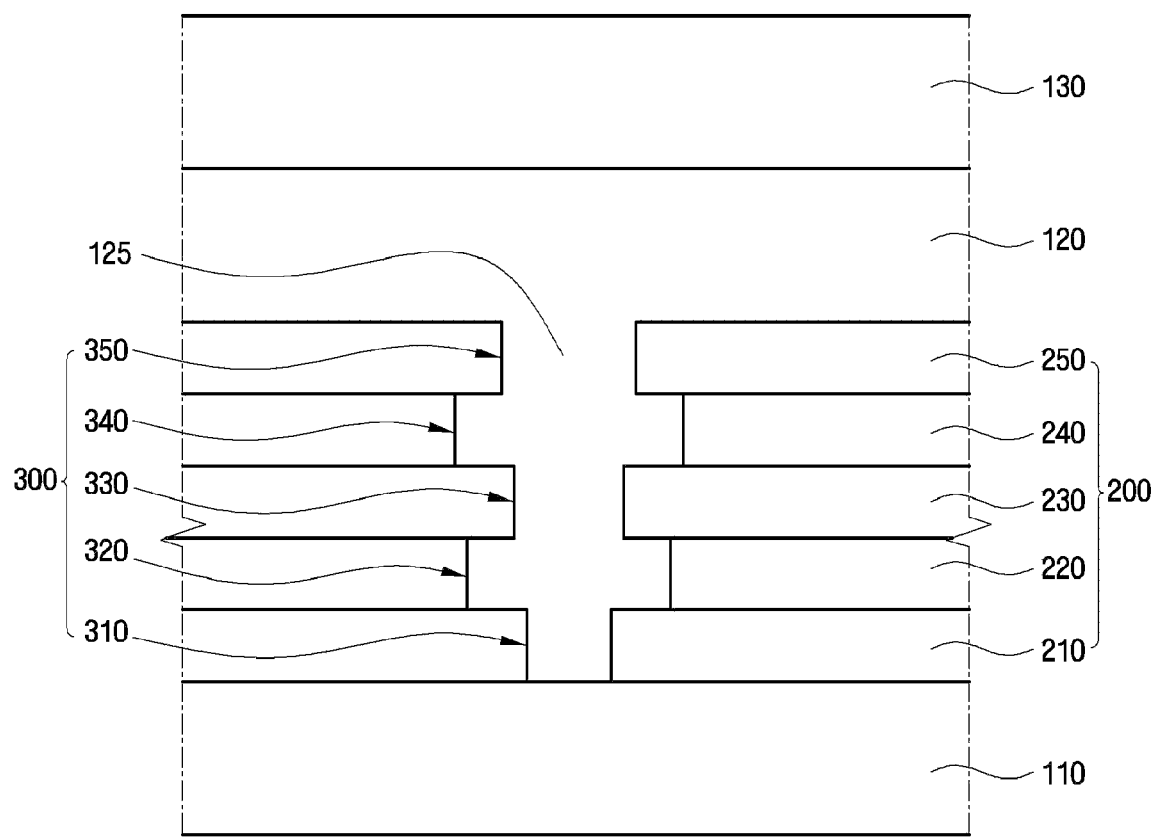
FIG. 22 and FIG. 23 are cross-sectional views showing a method of fabricating a display device according to an exemplary embodiment of the present invention.
Figure 23:
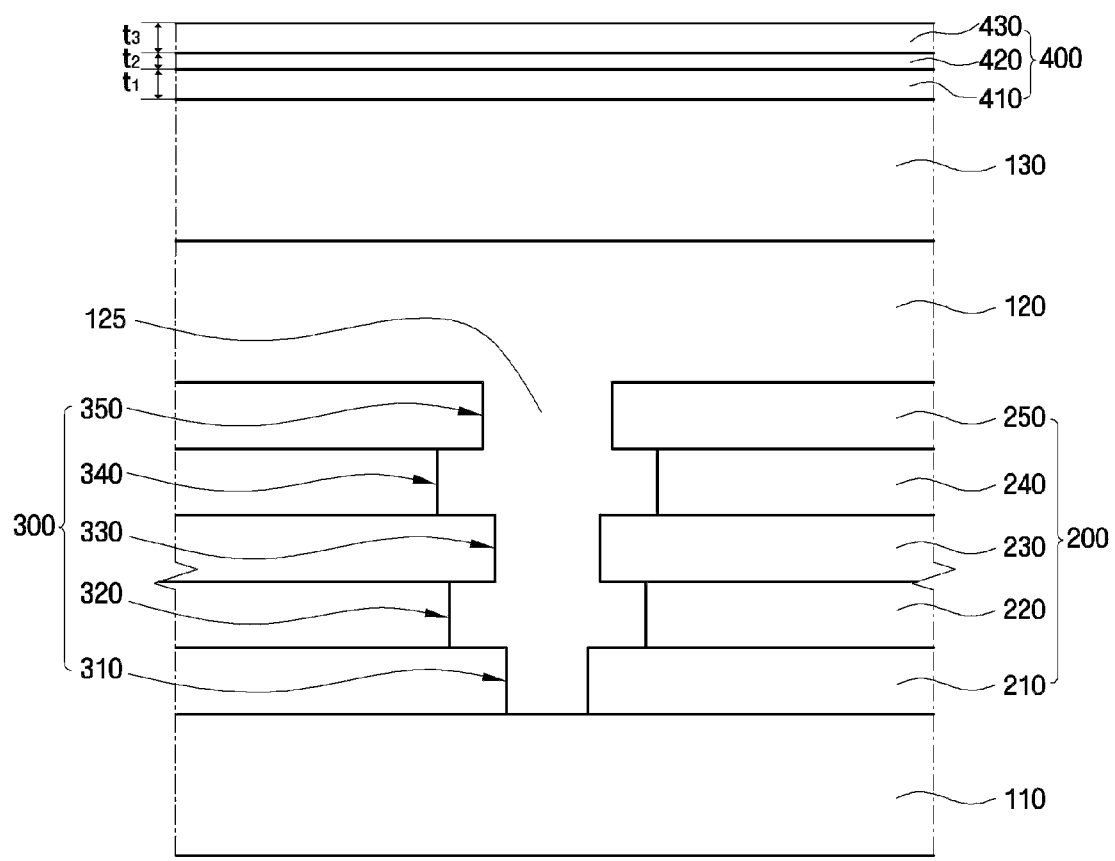

Hereinafter, a method of fabricating a display device according to an exemplary embodiment of the present invention will be described with reference to FIG. 8, FIG. 9, FIG. 10, FIG. 11, FIG. 12, FIG. 13, FIG. 14, FIG. 22, and FIG. 23. FIG. 22 and FIG. 23 are cross-sectional views showing a method of fabricating a display device according to an exemplary embodiment of the present invention.

First, the transflective layer 200 and the color filter layer 120 are formed using the processing steps described with reference to FIG. 8, FIG. 9, FIG. 10, FIG. 11, FIG. 12, FIG. 13, and FIG. 14.

Referring to FIG. 22, the overcoat layer 130 is formed on the color filter layer 120.

Referring to FIG. 23, the first refractive layer 410 is formed on the overcoat layer 130 to the first thickness t1, and the second refractive layer 420 is formed on the first refractive layer 410 to the second thickness t2. Next, the first refractive layer 430 is formed on the second refractive layer 420 to a third thickness t3.

Referring to FIG. 21, an anode layer 140, a light-emitting layer 150, and a cathode layer 160 are sequentially formed on the refraction layer 400, thereby completing a display panel.

Figure 24A:
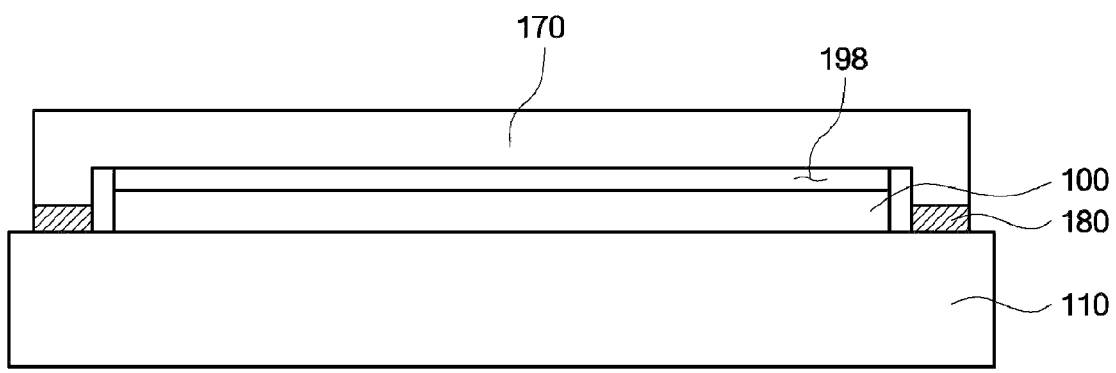
FIG. 24A is a schematic view of a display device including an encapsulation substrate, according to an exemplary embodiment of the present invention.

Hereinafter, a display device according to an exemplary embodiment of the present invention will be described in detail with reference to FIG. 24A and FIG. 24B. FIG. 24A is a schematic view of a display device including an encapsulation substrate 170, according to an exemplary embodiment of the present invention, and FIG. 24B is a vertical cross-sectional view schematically showing the display device according to the present exemplary embodiment.

Figure 24B:
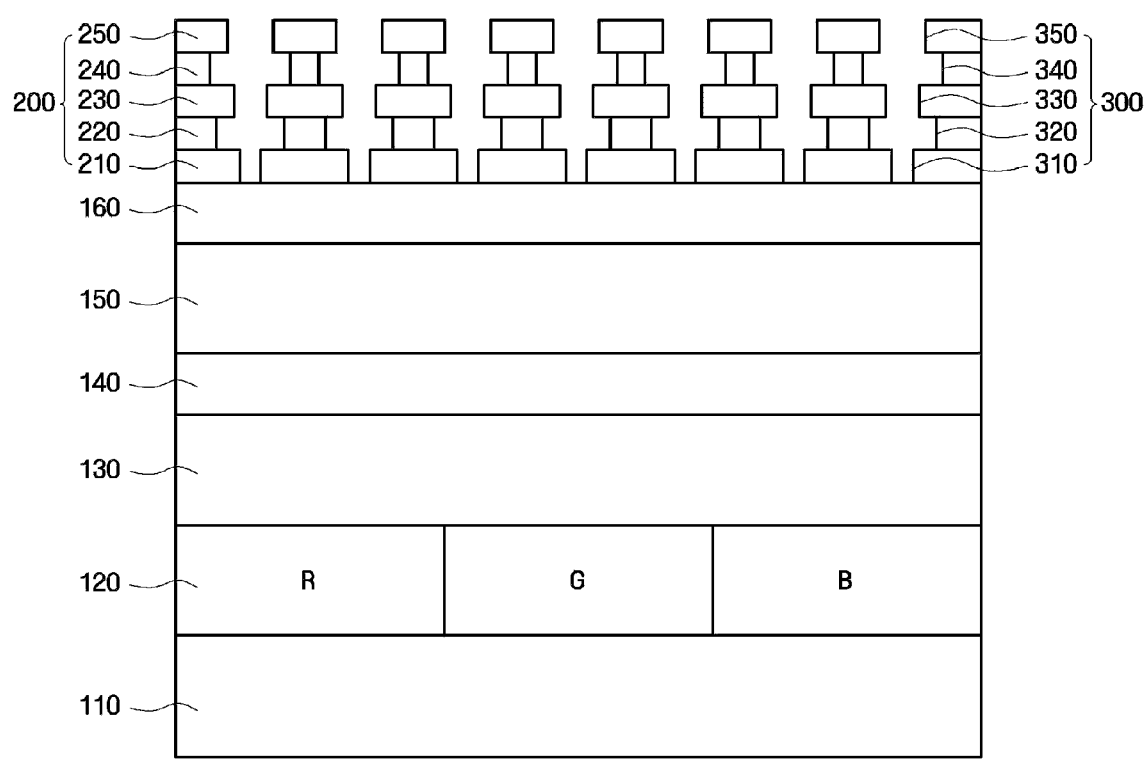
FIG. 24B is a vertical cross-sectional view of FIG. 24A, schematically showing the display device according to an exemplary embodiment of the present invention.

Referring to FIG. 24A and FIG. 24B, the display device according to the present exemplary embodiment will be described with regard to a front-surface emitting OLED. The encapsulation substrate 170 according to the present exemplary embodiment is separated from the cathode layer 160, and then adhered to the substrate 110.

A transflective layer 200 according to the present exemplary embodiment is substantially the same as that of the exemplary embodiment shown in FIG. 1A, FIG. 1B, and FIG. 2, except that a space 198 is disposed between the cathode layer 160 and the encapsulation substrate 170.

The anode layer 140 according to the present exemplary embodiment may be made of a reflective material such as Ag, Al, or the like and reflects light to a side of the cathode layer 160. The cathode layer 160 according to the present exemplary embodiment may be formed of a transparent electrode to allow the light emitted from the anode layer 140 to pass through. In detail, the cathode layer 160 may contain Ag formed of, for example, a foil, in consideration of work function and light transmittance.

Figure 25:
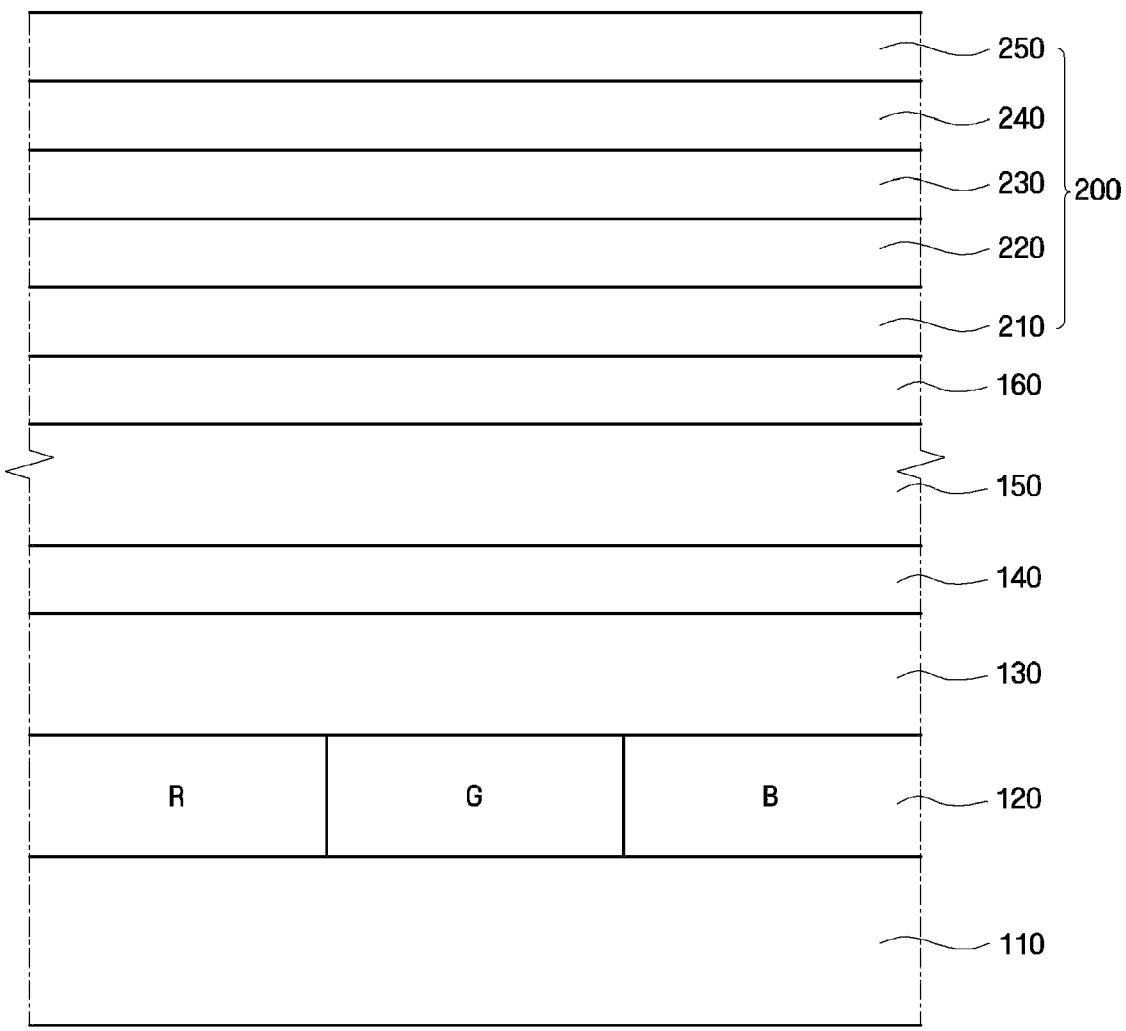
FIG. 25 is a cross-sectional view showing a method of fabricating a display device according to an exemplary embodiment of the present invention.

Hereinafter, a method of fabricating a display device according to another exemplary embodiment of the present invention will be described with reference to FIG. 8, FIG. 9, FIG. 10, FIG. 11, FIG. 12, FIG. 13, FIG. 14, FIG. 24A, FIG. 24B, and FIG. 25. FIG. 25 is a cross-sectional view showing a method of fabricating a display device according to an exemplary embodiment of the present invention.

Referring to FIG. 25, a color filter layer 120, an overcoat layer 130, an anode electrode 140, a light-emitting layer 150, and a cathode electrode 160 are formed on a substrate 110.

Next, first diffusive layers 210, 230, and 250 having a first refractive index and second diffusive layers 220 and 240 having a second refractive index are formed on the cathode layer 160 to be alternately arranged.

Next, a via hole 300 penetrating the transflective layer 200 is formed using processing steps described with reference to FIG. 8, FIG. 9, FIG. 10, FIG. 11, FIG. 12, FIG. 13, FIG. 14, thereby providing the display device shown in FIG. 24B. The via hole 300 in the present exemplary embodiment may have a hollow inside.

Referring to FIG. 24A, the encapsulation substrate 170 is disposed on the transflective layer 200 and then adhered to the substrate 110, thereby completing the display device.

In the present exemplary embodiment, after forming the transflective layer 200 on the cathode layer 160, the encapsulation substrate 170 is disposed on the transflective layer 200 and then adhered to the substrate 110. However, the present invention is not limited to the exemplary embodiment as shown.

For example, after forming the transflective layer 200 on the encapsulation substrate 170, the substrate 110 having the cathode layer 160 may be adhered to the resulting product.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a substrate;
   a transflective layer comprising first diffusive layers and second diffusive layers alternately arranged, the first diffusive layers comprising a first diffusive material having a first refractive index, and the second diffusive layers comprising a second diffusive material having a second refractive index different from the first refractive index;
   a plurality of via holes formed in the transflective layer; and
   a light-emitting layer arranged on the substrate and configured to generate a light.

2. The display device of claim 1, wherein the first diffusive material comprises silicon oxide, and the second diffusive material comprises silicon nitride.

3. The display device of claim 1, further comprising a third diffusive material filling the via holes and having a third refractive index different from the first refractive index and the second refractive index.

4. The display device of claim 3, wherein the via holes each comprise a hexagonal prism shape, and the via holes are spaced apart from each other to form regular triangles.

5. The display device of claim 3, wherein the via holes correspond to external areas comprising a hexagonal prism shape comprising periodically appearing regular triangles spaced apart from each other.

6. The display device of claim 3, wherein the via holes comprise a rectangular prism shape, and the via holes are spaced apart from one another such that the first diffusive layers and the via holes or the second diffusive layers and the via holes comprise periodically appearing stripe shapes.

7. The display device of claim 1, wherein the transflective layer comprises:
   at least one of the first diffusive layers and at least one of the second diffusive layers arranged on a pair of the first diffusive layers and the second diffusive layers; and
   the via holes comprise first via holes formed in the first diffusive layers, and second via holes formed in the second diffusive layers, wherein a first inner diameter of each of first via holes or a second inner diameter of each of second via holes increases as a distance between each of the diffusive layers and the substrate increases.

8. The display device of claim 1, wherein the transflective layer comprises at least one of the first diffusive layers and at least one of the second diffusive layers arranged on a pair of the first diffusive layers and the second diffusive layers; and a second inner diameter of each of second via holes formed in the second diffusive layers is larger than a first inner diameter of each of first via holes formed in the first diffusive layers.

9. The display device of claim 1, wherein the transflective layer comprises at least one of the first diffusive layers and at least one of the second diffusive layers arranged on a pair of the first diffusive layers and the second diffusive layers; and a second inner diameter of each of second via holes formed in the second diffusive layers is the same as a first inner diameter of each of first via holes formed in the first diffusive layers.

10. The display device of claim 1, further comprising a color filter layer arranged directly on a topmost diffusive layer and comprising a color organic material having a third refractive index different from the first refractive index and the second refractive index.

11. The display device of claim 10, wherein the color organic material fills the via holes.

12. The display device of claim 1, further comprising an overcoat layer arranged on a topmost diffusive layer and comprising a color organic material having a fourth refractive index different from the first refractive index and the second refractive index.

13. The display device of claim 12, wherein the color organic material fills the via holes.

14. The display device of claim 1, further comprising a refraction layer comprising first refractive layers arranged on the transflective layer and a second refractive layer arranged on the transflective layer, the first refractive layers and the second refractive layer being alternately arranged, the first refractive layers having a third refractive index and comprising a first thickness, and a second refractive layer having a fourth refractive index different from the third refractive index and comprising a second thickness different from the first thickness.

15. A method of fabricating a display device, the method comprising:
    forming a transflective layer comprising first diffusive layers and second diffusive layers alternately arranged on a substrate, the first diffusive layers comprising a first diffusive material having a first refractive index, and the second diffusive layers comprising a second diffusive material having a second refractive index different from the first refractive index;
    forming a plurality of via holes in the transflective layer; and
    arranging a light-emitting layer on the substrate,
    wherein the light-emitting layer is configured to generate a light.

16. The method of claim 15, wherein forming the plurality of via holes comprises alternately etching the first diffusive layers using a first etching gas and etching the second diffusive layers using a second etching gas, the second etching gas comprising a different type of gas from the first etching gas.

17. The method of claim 16, wherein the via holes each comprise a plurality of first via holes formed in the first diffusive layers, respectively, and a plurality of second via holes formed in the second diffusive layers, respectively, a topmost transflective layer is the first diffusive layer, and etching the second diffusive layer using the second etching gas comprises overetching the second diffusive layers such that second inner diameters of the second via holes become larger than first inner diameters of the first via holes.

18. The method of claim 16, wherein the first diffusive material comprises silicon oxide, the second diffusive material comprises silicon nitride, the first etching gas comprises $C_4H_8+H_2$, and the second etching gas comprises $CF_4+O_2$.

19. The method of claim 15, wherein forming the plurality of via holes comprises alternately etching the first diffusive layers and the second diffusive layers using an etching gas.

20. The method of claim 15, after forming the via holes, further comprising forming an overcoat layer on a topmost diffusive layer using a color organic material having a fourth refractive index different from the first refractive index and the second refractive index.

* * * * *